United States Patent
Lee et al.

(10) Patent No.: US 9,184,407 B2
(45) Date of Patent: Nov. 10, 2015

(54) ORGANIC LIGHT EMITTING DEVICE HAVING STACKED ELECTRON TRANSPORT LAYERS

(71) Applicant: Samsung Display Co., Ltd., Yongin, Gyeonggi-do (KR)

(72) Inventors: Sun-Hye Lee, Suwon-si (KR); Jae-Bok Kim, Hwaseong-si (KR); Won-Jun Song, Hwaseong-si (KR); Myung-Hwan Kim, Seongnam-si (KR); Ji-Young Kim, Seoul (KR); Hye-Lim Shin, Suwon-si (KR); Tae-Kyu Shim, Seoul (KR); Yoon-Kyoo Lee, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 14/334,623

(22) Filed: Jul. 17, 2014

(65) Prior Publication Data
US 2015/0028308 A1    Jan. 29, 2015

(30) Foreign Application Priority Data
Jul. 25, 2013    (KR) ........................ 10-2013-0088191

(51) Int. Cl.
*H01L 51/50*    (2006.01)
*H01L 51/52*    (2006.01)
(Continued)

(52) U.S. Cl.
CPC .......... *H01L 51/508* (2013.01); *H01L 51/0002* (2013.01); *H01L 51/0052* (2013.01); *H01L 51/0067* (2013.01); *H01L 51/5237* (2013.01); *H01L 51/56* (2013.01); *H01L 51/5048* (2013.01); *H01L 51/5088* (2013.01)

(58) Field of Classification Search
CPC ... H01L 51/508; H01L 51/56; H01L 51/5237; H01L 51/0002; H01L 51/0052; H01L 51/0067; H01L 51/5048; H01L 51/5088
See application file for complete search history.

(56) References Cited

U.S. PATENT DOCUMENTS 6,097,147 A    8/2000    Baldo et al.
7,365,486 B2 *    4/2008    Lee et al. ...................... 313/504
(Continued)

FOREIGN PATENT DOCUMENTS

| KR | 10-2011-0007124 A | 1/2011 |
|---|---|---|
| KR | 10-1162932 B1 | 7/2012 |
| KR | 10-2013-0020398 A | 2/2013 |

OTHER PUBLICATIONS

Korean Patent Abstracts No. 10-2010-0073954 A for Patent No. KR 10-1162932 B1, Jul. 5, 2012, 2 Pages.

*Primary Examiner* — Ida M Soward
(74) *Attorney, Agent, or Firm* — Christie, Parker & Hale, LLP

(57) ABSTRACT

An organic light emitting device including: a first electrode, a hole injection layer on the first electrode, a hole transport layer on the hole injection layer, an organic light emitting layer on the hole transport layer, a first electron transport layer on the organic light emitting layer, a second electron transport layer on the organic light emitting layer, an electron injection layer on the second electron transport layer and a second electrode on the electron injection layer, where the first electron transport layer includes a first material for improving a thermal stability, a second material for improving a luminous efficiency and a third material for reducing a driving voltage, and the second electron transport layer is laminated with the first electron transport layer, and the second electrode faces the first electrode.

11 Claims, 12 Drawing Sheets

(51) Int. Cl.
*H01L 51/00* (2006.01)
*H01L 51/56* (2006.01)

(56) References Cited

U.S. PATENT DOCUMENTS

| | | | |
|---|---|---|---|
| 7,973,467 B2 * | 7/2011 | Song et al. | 313/504 |
| 8,525,160 B2 * | 9/2013 | Lee et al. | 257/40 |
| 8,557,398 B2 * | 10/2013 | Song et al. | 428/690 |
| 8,795,851 B2 * | 8/2014 | Inoue et al. | 428/690 |
| 8,847,210 B2 * | 9/2014 | Ko et al. | 257/40 |
| 2005/0248267 A1 * | 11/2005 | Gyoutoku et al. | 313/506 |
| 2009/0167159 A1 * | 7/2009 | Song et al. | 313/504 |
| 2009/0212688 A1 * | 8/2009 | Song et al. | 313/504 |
| 2009/0218934 A1 * | 9/2009 | Song et al. | 313/504 |
| 2011/0012095 A1 * | 1/2011 | Adamovich et al. | 257/40 |
| 2011/0037062 A1 | 2/2011 | Fukumatsu et al. | |
| 2011/0095282 A1 | 4/2011 | Pflumm et al. | |
| 2011/0180792 A1 * | 7/2011 | Lee et al. | 257/40 |
| 2011/0215308 A1 * | 9/2011 | Im et al. | 257/40 |
| 2012/0018707 A1 * | 1/2012 | Lee et al. | 257/40 |
| 2013/0105787 A1 * | 5/2013 | Tanaka et al. | 257/40 |
| 2013/0277648 A1 * | 10/2013 | Su et al. | 257/40 |
| 2013/0313527 A1 * | 11/2013 | Kim | 257/40 |
| 2014/0051827 A1 * | 2/2014 | Endo et al. | 528/405 |
| 2014/0061604 A1 * | 3/2014 | Seo et al. | 257/40 |
| 2014/0252338 A1 * | 9/2014 | Seo et al. | 257/40 |
| 2014/0299861 A1 * | 10/2014 | Osaka et al. | 257/40 |

* cited by examiner

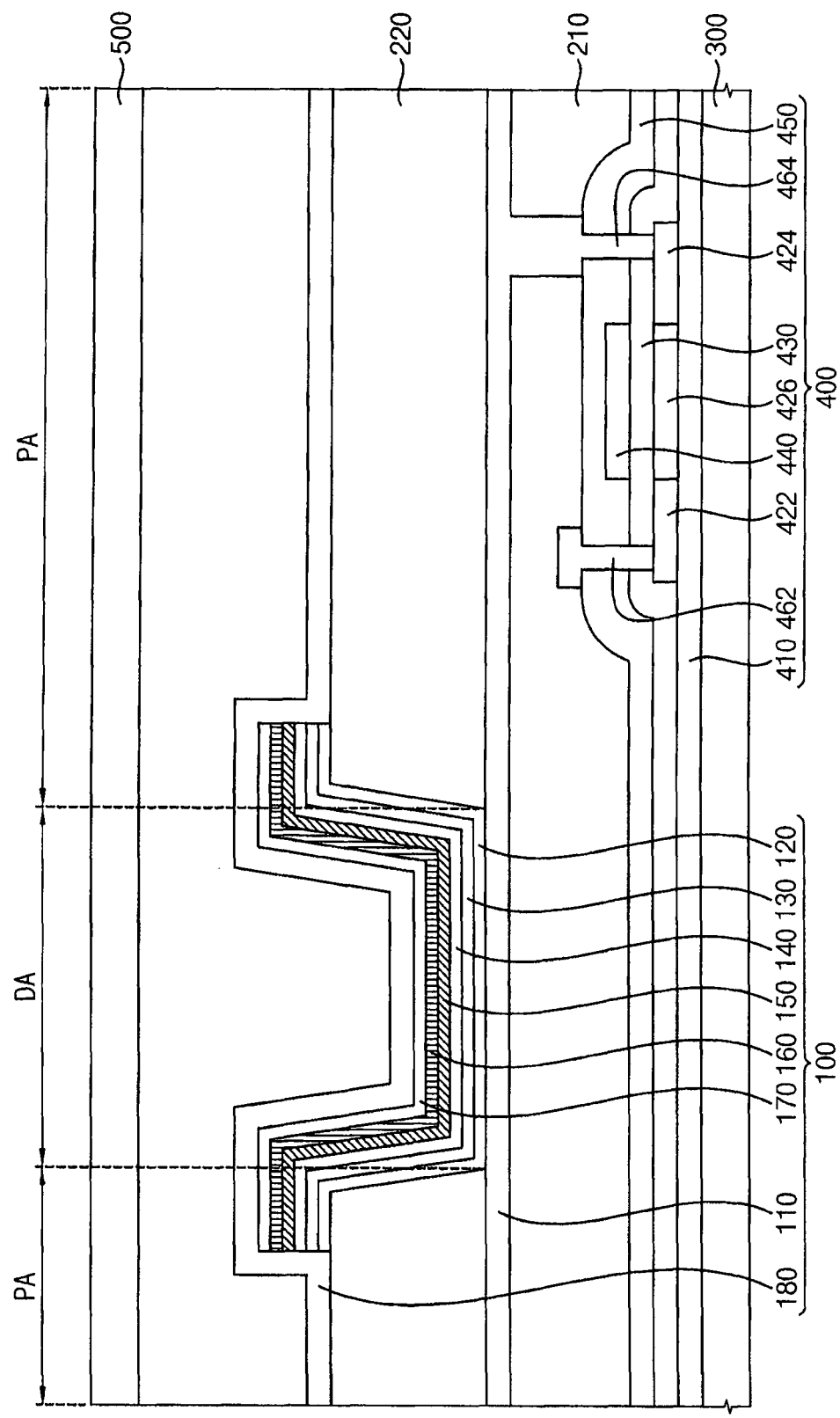

ORGANIC LIGHT EMITTING DEVICE HAVING STACKED ELECTRON TRANSPORT LAYERS

CROSS-REFERENCE TO RELATED APPLICATION

This application claims priority to and the benefit of Korean Patent Application No. 10-2013-0088191, filed in the Korean Intellectual Property Office (KIPO) on Jul. 25, 2013, the entire content of which is incorporated herein by reference.

BACKGROUND

1. Field

Example embodiments of the present disclosure relate generally to an organic light emitting device, an organic light emitting display apparatus and a method of manufacturing the organic light emitting display apparatus. For example, aspects of embodiments of the present invention relate to an organic light emitting device having improved luminous efficiency and thermal stability, an organic light emitting display apparatus including the organic light emitting device and a method of manufacturing the organic light emitting display apparatus.

2. Description of the Related Art

An organic light emitting device is a device for light emission by an organic light emitting layer interposed between two opposite electrodes to which a predetermined (or set) voltage is applied. For example, when the predetermined (or set) voltage is applied to the two opposite electrodes, electrons and holes which are injected from the two opposite electrodes form excitons by combining with each other in the organic light emitting layer. The organic light emitting layer emits a light having a specific wavelength by transferring the excitons from an excited state to a lower energy state.

Such an organic light emitting device is applied to (or included in) an organic light emitting display apparatus to provide a self emission property. The organic light emitting display apparatus has been identified (or spotlighted) as a next generation display apparatus, because the organic light emitting display apparatus does not need a backlight unit and has a slim thickness, light weight, low power consumption, advanced color reproduction and fast response time.

The organic light emitting device should have suitable (or proper) transport property of electrons and holes in order to combine (or easily combine) the electrons and the holes, which are injected from the two opposite electrodes, in the organic light emitting layer, thereby increasing the formation of the excitons. Thus, the organic light emitting device may include some organic layers to improve the transport property of the electrons and the holes, and the organic layers may be disposed on an upper surface or a lower surface of the organic light emitting layer.

For example, the organic light emitting device may include an electron transport layer. The electron transport layer includes various materials. A few materials are capable of providing the suitable (or proper) transport property of electrons. However, when the electron transport layer is formed with such materials, a thermal stability, a luminous efficiency and a lifetime of the organic light emitting device are reduced.

SUMMARY

Some aspects of example embodiments according to the present invention provide an organic light emitting device having a high luminous efficiency, a long lifetime and an advanced thermal stability.

Some aspects of example embodiments according to the present invention provide an organic light emitting display apparatus having a high resolution display and a long lifetime.

Some aspects of example embodiments according to the present invention provide a method of manufacturing the organic light emitting display apparatus having the high resolution display and the long lifetime.

According to some example embodiments of the present invention, an organic light emitting device includes a first electrode, a hole injection layer on the first electrode, a hole transport layer on the hole injection layer, an organic light emitting layer on the hole transport layer, a first electron transport layer on the organic light emitting layer, a second electron transport layer on the organic light emitting layer, an electron injection layer on the second electron transport layer and a second electrode on the electron injection layer, where the first electron transport layer includes a first material for improving a thermal stability of the organic light emitting device, a second material for improving a luminous efficiency of the organic light emitting device and a third material for reducing a driving voltage of the organic light emitting device, and the second electron transport layer is laminated with the first electron transport layer, and the second electrode faces the first electrode.

In an example embodiment, the first material may include an anthracene derivative.

In an example embodiment, the second material may include at least one selected from the group consisting of a pyrazine derivative and a triazine derivative.

In an example embodiment, the third material may include at least one selected from the group consisting of an alkali metal and a complex of the alkali metal.

In an example embodiment, the first electron transport layer may include the first material in a range of about 20% to about 80% by weight ratio, based on the total weight of the first electron transport layer.

In an example embodiment, the first electron transport layer may have a thickness of about 25 Å to about 200 Å.

In an example embodiment, the second electron transport layer may include a fourth material for improving the luminous efficiency of the organic light emitting device.

In an example embodiment, the fourth material may include at least one selected from the group consisting of a pyrazine derivative and a triazine derivative.

In an example embodiment, the second electron transport layer may further include a fifth material to reduce the driving voltage of the organic light emitting device.

In an example embodiment, the fifth material may include at least one selected from the group consisting of an alkali metal and a complex of the alkali metal.

In an example embodiment, the fourth material may be substantially the same as the second material, and the fifth material may be substantially the same as the third material.

According to some example embodiments, an organic light emitting display apparatus includes a first substrate, a switching device on the first substrate, an organic light emitting device electrically connected to the switching device and a second substrate on the organic light emitting device, where the organic light emitting device includes a first electrode, a hole injection layer on the first electrode, a hole transport layer on the hole injection layer, an organic light emitting layer on the hole transport layer, a first electron transport layer on the organic light emitting layer, a second electron transport layer on the organic light emitting layer, an electron injection layer on the second electron transport layer and a second electrode on the electron injection layer, where the first electron transport layer includes a first material for improving a thermal stability of the organic light emitting device, a second material for improving a luminous efficiency of the organic light emitting device and a third material for reducing a driving voltage of the organic light emitting device, the second electron transport layer is laminated with the first electron transport layer, and the second electrode faces the first electrode.

In an example embodiment, the first material may include an anthracene derivative, the second material may include at least one selected from the group consisting of a pyrazine derivative and a triazine derivative, and the third material may include at least one selected from the group consisting of an alkali metal and a complex of the alkali metal.

In an example embodiment, the second electron transport layer may include a fourth material for improving the luminous of the organic light emitting device and a fifth material to reduce the driving voltage of the organic light emitting device.

In an example embodiment, the fourth material may include at least one selected from the group consisting of a pyrazine derivative and a triazine derivative, and the fifth material may include at least one selected from the group consisting of an alkali metal and a complex of the alkali metal.

According to some example embodiments, a method of manufacturing an organic light emitting display apparatus includes providing a first electrode on a first substrate on which a switching device is formed, providing a hole injection layer on the first electrode, providing a hole transport layer on the hole injection layer, providing an organic light emitting layer on the hole transport layer, providing a first electron transport layer on the organic light emitting layer, providing a second electron transport layer laminated with the first electron transport layer on the organic light emitting layer, providing an electron injection layer on the second electron transport layer, providing a second electrode facing the first electrode on the electron injection layer, and encapsulating the switching device and the organic light emitting layer with a second substrate, where the first electron transport layer includes a first material for improving a thermal stability of the organic light emitting device, a second material for improving a luminous efficiency of the organic light emitting device and a third material for reducing a driving voltage of the organic light emitting device.

In an example embodiment, the first electron transport layer may be formed by co-depositing the first material, the second material and the third material, where the first material may include an anthracene derivative, the second material may include at least one selected from the group consisting of a pyrazine derivative and a triazine derivative, and the third material may include at least one selected from the group consisting of an alkali metal and a complex of the alkali metal.

In an example embodiment, the first electron transport layer may be provided by providing a first mixture including the first material, the second material and the third material, and depositing a first mixture layer including the first mixture on the organic light emitting layer, where the first material may include an anthracene derivative, the second material may include at least one selected from the group consisting of a pyrazine derivative and a triazine derivative, and the third material may include at least one selected from the group consisting of an alkali metal and a complex of the alkali metal.

In an example embodiment, the second electron transport layer may be formed by co-depositing a fourth material and a fifth material, where the fourth material may include at least one selected from the group consisting of a pyrazine derivative and a triazine derivative, and the fifth material may include at least one selected from the group consisting of an alkali metal and a complex of the alkali metal.

In an example embodiment, the second electron transport layer may be provided by providing a second mixture including a fourth material and a fifth material, and depositing a second mixture layer including the second mixture on the first electron transport layer, where the fourth material may include at least one selected from the group consisting of a pyrazine derivative and a triazine derivative, and the fifth material may include at least one selected from the group consisting of an alkali metal and a complex of the alkali metal.

An organic light emitting device in accordance with example embodiments of the present invention has not only a high luminous efficiency and a long lifetime, but also advanced thermal stability. Also, an organic light emitting display apparatus according embodiments of the present invention can display high resolution images regardless of a change of operating temperature. In addition, according to a method of manufacturing an organic light emitting display apparatus in accordance with example embodiments of the present invention, the organic light emitting display apparatus having a high luminous efficiency, a long lifetime and an advanced thermal stability can be manufactured.

BRIEF DESCRIPTION OF THE DRAWINGS

Non-limiting example embodiments of the present disclosure will be more clearly understood from the following detailed description taken in conjunction with the accompanying drawings, which serve to explain principles of the present disclosure.

FIGS. 9A to 9F are cross-sectional views illustrating an embodiment of a method of manufacturing the organic light emitting display apparatus of FIG. 8.

DETAILED DESCRIPTION

Figure 1:
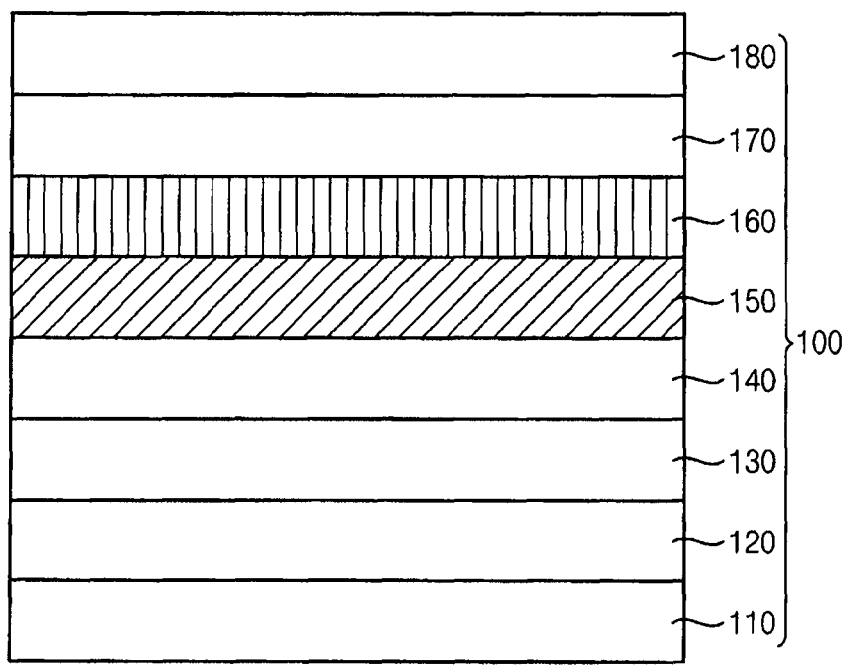
FIG. 1 is a cross-sectional view illustrating an organic light emitting device in accordance with an example embodiment of the present invention.

Various example embodiments of the present disclosure will be described more fully hereinafter with reference to the accompanying drawings, in which only some example embodiments are shown and described, by way of illustration. The present invention may, however, be embodied in many different forms and should not be construed as being limited to the example embodiments set forth herein. Rather, these example embodiments are provided so that this disclosure will be thorough and complete, and will fully convey the scope of the present invention to those skilled in the art. In the drawings, the sizes and relative sizes of layers and regions may be exaggerated for clarity. Like numerals refer to like elements throughout. Expressions such as "at least one of," when preceding a list of elements, modify the entire list of elements and do not modify the individual elements of the list. Further, the use of "may" when describing embodiments of the present invention refers to "one or more embodiments of the present invention."

It will be understood that, although the terms first, second, third, etc. may be used herein to describe various elements, these elements should not be limited by terms first, second, third, etc. These terms are used to distinguish one element from another element. Thus, a first element discussed below could be termed a second element without departing from the teachings of the present invention. As used herein, the term "and/or" includes any and all combinations of one or more of the associated listed items.

It will be understood that when an element is referred to as being "connected" or "coupled" to another element, it can be directly connected or coupled to the other element or it can be indirectly connected or coupled to the other element with one or more intervening elements interposed therebetween. In contrast, when an element is referred to as being "directly connected" or "directly coupled" to another element, there are no intervening elements present. Also, in the context of the present application, when a first element is referred to as being "on" a second element, it can be directly on the second element or be indirectly on the second element with one or more intervening elements interposed therebetween. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which the present invention pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In understanding reference marks added to each elements of the present invention in each drawing, it is carefully understood that same elements have the same reference marks herein, although it is marked in other drawings. Additionally in describing the present invention, if the detailed description of well known elements or functions related to the present invention were confused with the same concept, it could be omitted. For example, where it would be duplicative to include description of a feature described elsewhere in the present disclosure, such description may be omitted.

FIG. 1 is a cross-sectional view illustrating an organic light emitting device in accordance with an example embodiment of the present invention.

Referring to FIG. 1, an organic light emitting device 100 includes a first electrode 110, a hole injection layer 120 on (e.g., directly on or disposed on) the first electrode 110, a hole transport layer 130 on (e.g., directly on or disposed on) the hole injection layer 120, an organic light emitting layer 140 on (e.g., directly on or disposed on) the hole transport layer 130, a first electron transport layer 150 on (e.g., directly on or disposed on) the organic light emitting layer 140, a second electron transport layer 160 on (e.g., directly on or disposed on) the organic light emitting layer 140, where the second electron transport layer 160 is laminated with the first electron transport layer 150, an electron injection layer 170 on (e.g., directly on or disposed on) the second electron transport layer 160, and a second electrode 180 on (e.g., directly on or disposed on) the electron injection layer 170, the second electrode 180 facing (or opposing) the first electrode 110. Hereinafter, each element of the organic light emitting device in accordance with example embodiments will be described in more detail.

The first electrode 110 and the second electrode 180 face (or oppose) each other, and are conductive (e.g., electrically conductive). In one example embodiment, the first electrode 110 may be an anode providing holes to the organic light emitting layer 140, and the second electrode 180 may be a cathode providing electrons to the organic light emitting layer 140. In another example embodiment, the first electrode 110 may be a cathode and the second electrode 180 may be an anode.

The first electrode 110 and the second electrode 180 may each be a reflective electrode, a transmitting (e.g., transmissive or transparent) electrode or a transflective electrode (e.g., a transmissive and reflective electrode), according to a direction of light emission of the organic light emitting device 100. For example, when the organic light emitting device 100 is a top emission device, the first electrode 110 may be a reflective electrode, and the second electrode 180 may be a transmitting electrode or a transflective electrode. On the other hand, when the organic light emitting device 100 is a bottom emission device, the first electrode 110 may be a transmitting electrode or a transflective electrode, and the second electrode 180 may be a reflective electrode. Herein, a "reflective" feature (e.g., a reflective electrode) has a reflectance of an incident light in a range of about 70% to about 100%. A "transflective" feature (e.g., a transflective electrode or a semitranslucent electrode) has a reflectance of an incident light in a range of about 30% to about 70%. A "transmitting" feature (e.g., a transmitting electrode) has a reflectance of an incident light equal to or less than about 30%.

In an example embodiment, when the first electrode 110 is a reflective electrode, the first electrode 110 may include at least one of a metal, a metal alloy, or a combination thereof, having a high reflectance. For example, the first electrode 110 may include aluminum (Al), silver (Ag), platinum (Pt), gold (Au), chromium (Cr), tungsten (W), molybdenum (Mo), titanium (Ti), palladium (Pd), an alloy thereof or a combination thereof, but the first electrode is not limited thereto. For example, the alloy may be a silver-copper-gold (Ag—Cu—Au: "ACA") alloy or a silver-palladium-copper (Ag—Pd—Cu: "APC") alloy but the alloy is not limited thereto. In an example embodiment, the first electrode 110 may have a single-layered structure or a multi-layered structure including the metal and/or the alloy.

In an example embodiment, when the second electrode 180 is a transflective electrode, the second electrode 180 may include a thin metal layer. In such an embodiment, the second electrode 180 may exhibit both reflectance and transmittance. When the second electrode 180 is substantially thick, e.g., thicker than a predetermined (or set) thickness, the luminescence of the organic light emitting device 100 may be decreased. Thus, the second electrode 180 should be suitably thin (or thin enough). For example, the second electrode 180 may have a thickness substantially equal to or less than about 20 nm. For example, the second electrode 180 may include at least one of aluminum, silver, platinum, gold, chromium, tungsten, molybdenum, titanium, palladium, an alloy thereof, or combination thereof, but the second electrode is not limited thereto.

In an example embodiment, the second electrode 180 may include a transparent conductive material. For example, the second electrode 180 may include at least one of an indium zinc oxide (IZO), an indium tin oxide (ITO), a gallium tin oxide, a zinc oxide (ZnOx), a gallium oxide (GaOx), a tin oxide (SnOx), an indium oxide (InOx) or a combination thereof, but the second electrode is not limited thereto.

In an example embodiment, the second electrode 180 may have a multi-layered structure including a plurality of transmitting layers or a plurality of transflective layers having different refractive indexes.

In an example embodiment, the hole injection layer 120 is between (e.g., directly contacting both or disposed between) the first electrode 110 and the second electrode 180. For example, the hole injection layer 120 may be on (e.g., directly on or disposed on) the first electrode 110. In this embodiment, the first electrode 110 is an anode. For example, the hole injection layer 120 may include at least one selected from a 4,4',4''-tris(3-methylphenylamino)triphenylamine ("m-MTDATA"), a 3,5-tris[4-(3-methylphenyl amino)phenyl]benzene ("m-MTDAPB"), a phthalocyanine compound such as copper phthalocyanine ("CuPc"), a starburst amine (e.g., a 4,4',4''-tris(N-carbazolyl)triphenylamine or "TCTA") and a N,N'-di(4-(N,N'-diphenylamino)phenyl)-N,N'-diphenylbenzidine ("DNTPD"). However, the material of the hole injection layer 120 is not limited by the materials listed above. In such an embodiment, the hole injection layer 120 provide holes to the organic light emitting layer 140 more easily by extracting holes from the anode.

In an example embodiment, the hole transport layer 130 may be on (e.g., directly on or disposed on) the hole injection layer 120. For example, the hole transport layer 130 may include at least one selected from a n-phenylcarbazole, a polyvinylcarbazole, a 1,3,5-tricarbazole-benzene, 4,4'-bis carbazolyl biphenyl, a m-bis carbazolyl phenyl, 4,4'-bis carbazolyl-2,2'-dimethyl biphenyl, a 4,4',4''-tri(N-carbazolyl)triphenylamine, a 1,3,5-tri(2-carbazolylphenyl)benzene, a 1,3,5-tris(2-carbazolyl-5-methoxy phenyl)benzene, a bis(4-carbazolyl phenyl)silane, a N,N'-diphenyl-N,N'-bis(1-naphthyl)-(1,1-biphenyl)-4,4'-diamine ("NPB"), a N,N'di(naphthalene-1-yl)-N,N'-diphenyl benezidine ("α-NPD"), a (N,N-bis(3-methylphenyl)-N,N-diphenyl-[1,1-biphenyl]-4,4-diamine ("TPD"), a poly(9,9-dioctylfluorene-co-N-(4-butylphenyl)diphenylamine ("TFB") a poly(9,9-dioctylfluorene-co-bis-(4-butylphenyl-bis-N,N-phenyl-1,4-phenylenediamin) ("PFB"), and a combination thereof, but the hole transport layer is not limited thereto. In such an embodiment, the hole transport layer 130 substantially improves transport property of holes provided from the hole injection layer 120.

In the example embodiment, the organic light emitting layer 140 may be on (e.g., directly on or disposed on) the hole transport layer 130. The organic light emitting layer 140 may include a light emission host and a light emission dopant.

The organic light emitting device 100 may be a fluorescence organic light emitting device and/or a phosphorescence organic light emitting device depending upon a manner in which light is emitted. When excitons that are formed by electrons and holes provided from the first electrode 110 and the second electrode 180, respectively, are transferred to a ground state from an excited state, the excitons may transition between the excited state and the ground state via phosphorescence or fluorescence. Phosphorescence is a phenomenon of light emission by some energy released when the excitons are transferred to the ground state from a triplet excited state, and fluorescence is a phenomenon of light emission by some energy released when the excitons are transferred to the ground state from a singlet excited state. As used herein, the expression "the light emission" is a concept encompassing "fluorescence" and "phosphorescence." Thus, as used herein, "the organic light emitting layer," "the organic light emitting device," "the light emission host," "the light emission dopant" should each be understood as an element encompassing "fluorescence light emission" and/or "phosphorescence light emission."

In an example embodiment, the light emission host of the organic light emitting layer 140 may include a tris(8-hydroxyquinolinato)aluminum ("Alq3"), a 9,10-di(naphth-2-yl)anthracene ("ADN"), a 3-tert-butyl-9,10-di(naphth-2-yl)anthracene ("TBADN"), a 4,4'-bis(2,2-diphenyl-ethene-1-yl)-4,4'-dimethylphenyl ("p-DMDPNBi"), a tert(9,9-diarylfluorene)s ("TDAF"), a 2-(9,9'-spirobifluorene-2-yl)-9,9'-spirobifluorene ("BSDF"), a 2,7-bis(9,9'-spirobifluorene-2-yl)-9,9'-spirobifluorene ("TSDF"), a bis(9,9-diarylfluorene)s ("BDAF"), a 4,4'-bis(2,2-diphenyl-ethene-1-O-4,4'-di-(tert-butyl)phenyl ("p-TDPVBi"), for example, as a fluorescence host. The light emission host may also include a 1,3-bis(carbazol-9-yl)triphenylamine ("TcTa"), a 4,4'-bis(carbazol-9-yl)biphenyl ("CBP"), a 4,4'-bis(9-carbazolyl)-2,2'-dimethyl-biphenyl ("CDBP"), a 4,4'-bis(carbazol-9-yl)-9,9-dimethyl-fluorene ("DMFL-CBP"), a 4,4'-bis(carbazol-9-yl)-9,9-bis(9-phenyl-9H-carbazol)fluorine ("FL-4CBP"), a 4,4'-bis(carbazol-9-yl)-9,9-di-tolyl-fluorene ("DPFL-CBP"), a 9,9-bis(9-phenyl-9H-carbazol)fluorine ("FL-2CBP") or a combination thereof, as a phosphorescence host. However, the light emission host is not limited by the materials listed above.

The light emission dopant emits a light having a specific wavelength by transition energy provided from the light emission host, in the organic light emitting layer 140. For example, as a red light emission dopant, the light emission dopant may include a Octaethylporphine ("PtOEP"), a tris[1- phenylisoquinoline-C2, N]iridium(III) ("Ir(piq)$_3$"), an acetylacetoneate ("Btp2Ir(acac)"), a 4-(Dicyanomethylene)-2-tert-butyl-6-(1,1,7,7,-tetramethyljulolidyl-9-enyl)-4H-pyran ("DCJTB"), or a combination thereof, but the light emission dopant is not limited thereto. As a green light emission dopant, the light emission dopant may include a tris[2-phenylpyridineato-C2, N]iridium(III) ("Ir(ppy)$_3$"), a Bis(2-phenylpyridine) (acetylacetonate) iridium(III) ("Ir(ppy)2 (acac)"), a tris[2-(p-tolyl)pyridine]iridium(III) ("ir (mppy)$_3$"), or a combination thereof, for example, but the light emission dopant is not limited thereto. As a blue light emission dopant, the light emission dopant may also include a bis[4,6-difluorophenyl-pyridinato-N,C2] ("F2Irpic"), a Bis (4',6'-difluorophenylpyridinato)(3-(trif(Ir(dfppy)2(fptz), a ter-fluorene, or a combination thereof, for example, but the light emission dopant is not limited thereto.

In one example embodiment, the first electron transport layer 150 may be on (e.g., directly on or disposed on) the organic light emitting layer 140, and the second electron transport layer 160 may be on (e.g., directly on or disposed on) the first electron transport layer 150. In another example embodiment, the second electron transport layer 160 may be on (e.g., directly on or disposed on) the organic light emitting layer 140, and the first electron transport layer 150 may be on (e.g., directly on or disposed on) the second electron transport layer 160. In still another example embodiment, the second electron transport layer 160 may be omitted, and only the first electron transport layer 150 may be on (e.g., directly on or disposed on) the organic light emitting layer 140. In other words, the first electron transport layer 150 and the second electron transport layer 160 may be formed to be laminated to each other. Herein, the term "laminate" refers to providing a stacking structure to contact closely two and more different layers.

The first electron transport layer 150 may improve a thermal stability of the organic light emitting device 100, and the second electron transport layer 160 may improve an injection property of electrons, a luminous efficiency and a lifetime of the organic light emitting device 100.

Generally, the electron transport layer includes (or consists of) an electron transport material having suitable (or proper) energy level for transporting electrons received from the electron injection layer 170. For example, the electron transport layer may include (or consist of) one electron transport material selected from a tris(8-hydroxyquinolinato)aluminum ("Alq$_3$"), a 3-(4-biphenyl)-4-phenyl-5-(4-tert-butyl-phenyl)-1,2,4-triazole ("TAZ"), and an aluminum(III)bis(2-methyl-8-hydroxyquinolinato)4-phenylphenolate ("Balq"), or the electron transport layer includes (or consists of) a combination of the electron transport material and a metal complex such as a lithium quinolate ("LiQ"), but the electron transport layer is not limited thereto. Such an electron transport layer has a single-layered structure including one or two of the electron transport materials. Thus, such an electron transport layer has a limitation of having an advanced property.

In other words, some electron transport layers have properties that reduce a driving voltage of the organic light emitting device and improve the luminous efficiency, but some of those electron transport layers have a weakness in that they have low thermal stability. Other electron transport layers have advanced thermal stability, but some of those electron transport layers have a weakness in that they have low luminous efficiency and short lifetime.

However, the organic light emitting device 100 in accordance with example embodiments of the present invention has a two-layered structure including two different electron transport layers to complement each other's weakness. For example, an embodiment of the organic light emitting device 100 includes the first electron transport layer 150 to improve the thermal stability and the second electron transport layer 160 to improve the luminous efficiency and lifetime, as a laminated structure. Hereinafter, the first electron transport layer 150 and the second electron transport layer 160 will be described in more detail.

The first electron transport layer 150 may improve the thermal stability of the organic light emitting device 100. As used herein, the expression "thermal stability" of the organic light emitting device 100 refers to a change of the luminous efficiency according to the operating temperature organic light emitting device.

For example, as used herein, the expression "the thermal stability is high" means that the largest value of a difference between the luminous efficiency of the organic light emitting device 100 at 25° C. of operating temperature and the luminous efficiency at 45° C. of operating temperature is equal to or less than 3% of a difference between the maximum value and the minimum value of the luminous efficiency at all grey levels.

In addition, as used herein, the expression "the thermal stability is low" means that the largest value of the difference between the luminous efficiency at 25° C. of operating temperature and the luminous efficiency at 45° C. of operating temperature is equal to or more than 3% of a difference between the maximum value and the minimum value of the luminous efficiency at all grey levels.

For example, where a difference between the maximum value and the minimum value of the luminous efficiency of a certain organic light emitting device is 4 cd/A at all grey levels, and a luminous efficiency at 25° C. of operating temperature is 3.8 cd/A at 100 grey level, and a luminous efficiency at 45° C. of operating temperature is 3.4 cd/A at 100 grey level, and the difference of luminous efficiency in 100 grey level is a largest (or maximum) value, a change of the luminous efficiency of the organic light emitting device according to operating temperature is (3.8−3.4)/4=0.1=10%. Thus, the thermal stability of such an organic light emitting device is low.

On the other hand, where a difference between the maximum value and the minimum value of the luminous efficiency of a certain organic light emitting device is 4 cd/A at all grey levels, and a luminous efficiency at 25° C. of operating temperature is 3.9 cd/A at 100 grey level, and a luminous efficiency at 45° C. of operating temperature is 3.8 cd/A at 100 grey level, and the difference of luminous efficiency in 100 grey level is a largest (or maximum) value, a change of the luminous efficiency of the organic light emitting device according to operating temperature is (3.9−3.8)/4=0.025=2.5%. Thus, the thermal stability of such an organic light emitting display is high. Hereinafter, a concept of thermal stability will be described in more detail by referring to FIG. 2 and FIG. 3.

Figure 2:
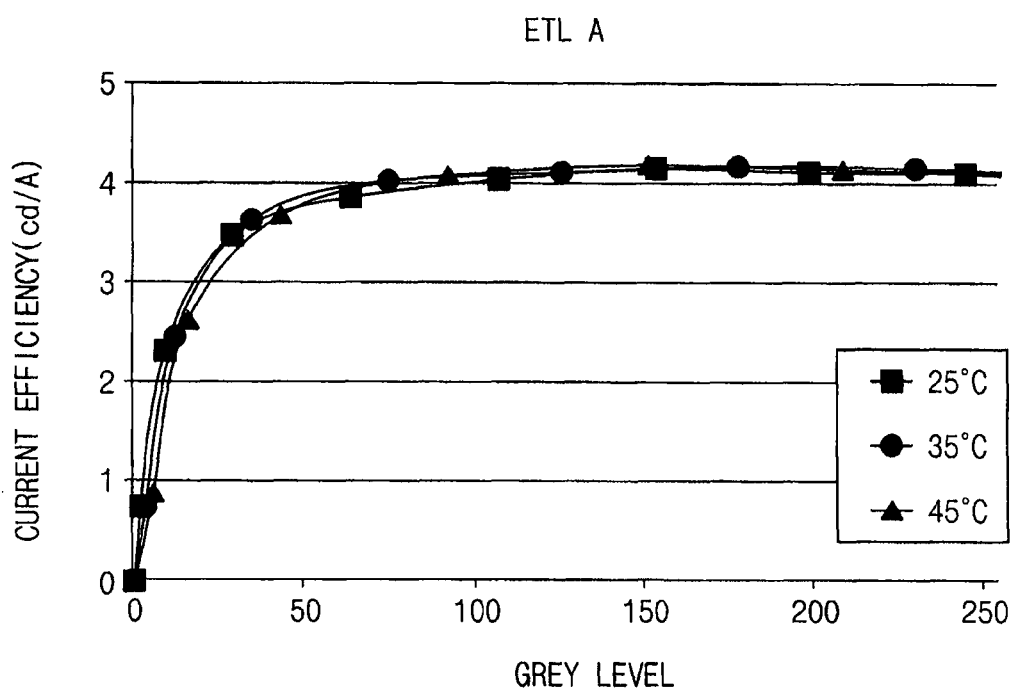
FIG. 2 is a graph illustrating a change of luminous efficiency at 25° C., 35° C. and 45° C., according to grey level, of an organic light emitting device including a single electron transport layer for improving a thermal stability.
Figure 3:
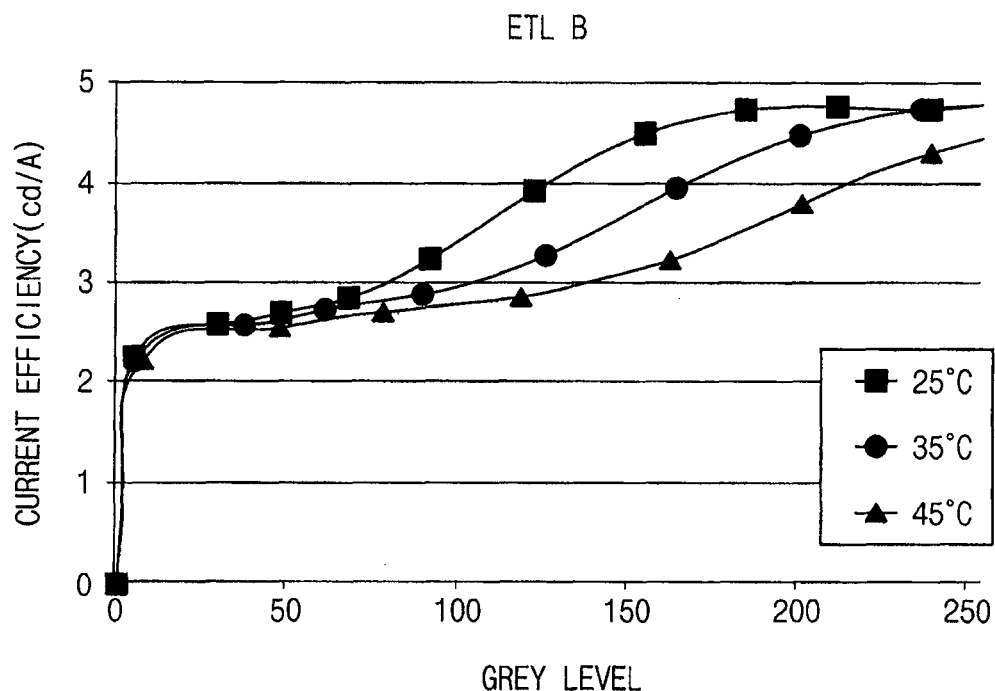
FIG. 3 is a graph illustrating a change of luminous efficiency of an organic light emitting device including a single electron transport layer for improving the luminous efficiency and a lifetime.

FIG. 2 is a graph illustrating a change of luminous efficiency at 25° C., 35° C. and 45° C., according to grey level, of an organic light emitting device including a single electron transport layer to improve a thermal stability. FIG. 3 is a graph illustrating a change of luminous efficiency at 25° C., 35° C. and 45° C., according to grey level, of an organic light emitting device including a single electron transport layer to improve the luminous efficiency and a lifetime.

Referring to FIG. 2, a change of the luminous efficiency of the organic light emitting device including a single electron transport layer, referred to as ETL A, to improve the thermal stability of the organic light emitting device is small according to operating temperature.

However, an average value of the luminous efficiency of the organic light emitting device of FIG. 2 is less than an average value of the organic light emitting device of FIG. 3, which includes a single electron transport layer, referred to as ETL B, to improve the luminous efficiency and the lifetime of the organic light emitting device.

On the other hand, referring to FIG. 3, the organic light emitting device including the single electron transport layer ETL B to improve the luminous efficiency and the lifetime exhibits a luminous efficiency that is sensitive to, and changes according to, operating temperature.

However, an average value of the luminous efficiency of the organic light emitting device of FIG. 3 is higher than the average value of the luminous efficiency of the organic light emitting device of FIG. 2, which includes the single electron transport layer ETL A to improve the thermal stability. In other words, the organic light emitting device of FIG. 2 has a low luminous efficiency and the organic light emitting device of FIG. 3 has a low thermal stability.

However, an organic light emitting device in accordance with example embodiments of the present invention has both a high luminous efficiency and an advanced (or high) thermal stability. Referring to FIG. 1 again, the first electron transport layer 150 of the organic light emitting device 100 may include a first material, a second material and a third material, which have properties that are different from one another, in order to improve, for example, the thermal stability.

For example, the first material may improve the thermal stability of the organic light emitting device 100, and the second material may improve the luminous efficiency of the organic light emitting device 100, and the third material may reduce the driving voltage of the organic light emitting device 100.

In an example embodiment, the first material may include an anthracene derivative. For example, the anthracene derivative may include at least one compound selected from compound 1 and compounds represented by the following formulae 1a to 1c, but the first material is not limited thereto.

compound 1

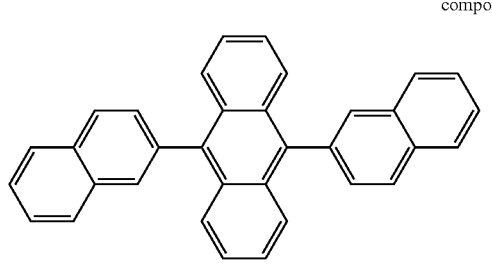

formula 1a

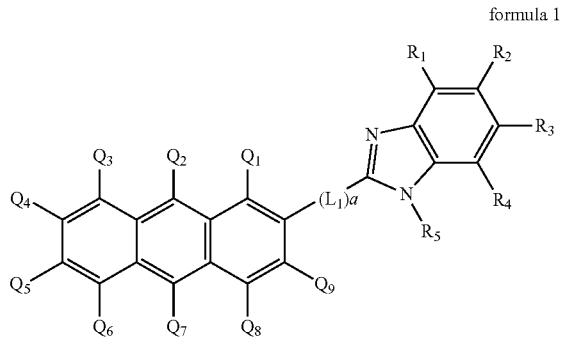

formula 1b

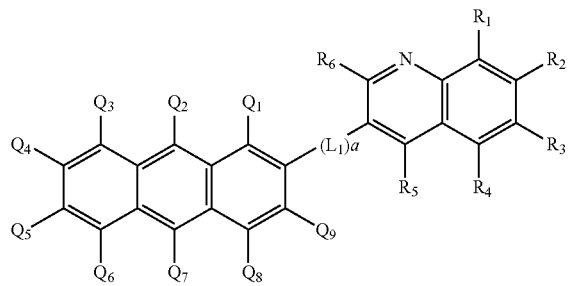

formula 1c

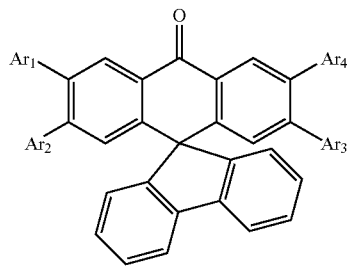

In formulae 1a and 1b above, $R_1$ to $R_6$ may each independently be a hydrogen atom, a halogen atom, a hydroxyl group, a cyano group, a substituted or unsubstituted $C_1$ to $C_{30}$ alkyl group, a substituted or unsubstituted $C_1$ to $C_{30}$ alkoxy group, a substituted or unsubstituted $C_1$ to $C_{30}$ acyl group, a substituted or unsubstituted $C_2$ to $C_{30}$ alkenyl group, a substituted or unsubstituted $C_2$ to $C_{30}$ alkynyl group, a substituted or unsubstituted $C_6$ to $C_{30}$ aryl group or a substituted or unsubstituted $C_2$ to $C_{30}$ heteroaryl group. Two or more of adjacent $R_1$ to $R_6$ may, optionally, combine to form a saturated or unsaturated ring system.

In formulae 1a and 1b above, $L_1$ may be a single bond, a substituted or unsubstituted $C_1$ to $C_{30}$ alkylene group, a substituted or unsubstituted $C_6$ to $C_{30}$ arylene group or a substituted or unsubstituted $C_2$ to $C_{30}$ heteroarylene group.

In formulae 1a and 1b above, $Q_1$ to $Q_9$ may each independently be a hydrogen atom, a substituted or unsubstituted $C_6$ to $C_{30}$ aryl group or a substituted or unsubstituted $C_2$ to $C_{30}$ heteroaryl group, and "a" may be an integer in a range of 1 to 10.

In formula 1c above, one of $Ar_1$ and $Ar_2$ may independently be a hydrogen atom, a phenyl group, a biphenyl group, a terphenyl group, a dimethylfluorenyl group, a triphenylene group, a dibenzofuran group or a dibenzothiophene group, and the other one of $Ar_1$ and $Ar_2$ may be a hydrogen atom.

In formula 1c above, one of $Ar_3$ and $Ar_4$ may independently be a hydrogen atom, a phenyl group, a biphenyl group, a terphenyl group, a dimethylfluorenyl group, a triphenylene group, a dibenzofuran group or a dibenzothiophene group, and the other one of $Ar_3$ and $Ar_4$ may be a hydrogen atom.

For example, the anthracene derivative may be at least one selected from a 9,10-di(naphthalene-2-yl)anthracene) ("ADN"), a 3-tert-butyl-9,10-di(naphth-2-yl)anthracene ("TBADN") and compounds 101 to compound 104, which are represented by the following formulas. However, the first material is not limited thereto. The first material may be any suitable material for improving the thermal stability of the organic light emitting device 100.

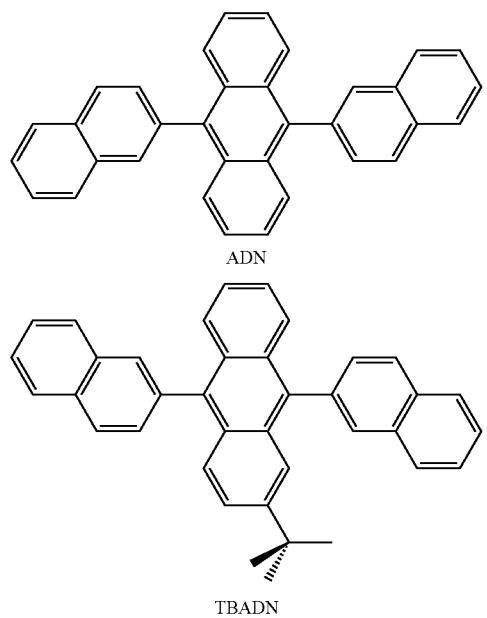
ADN

TBADN

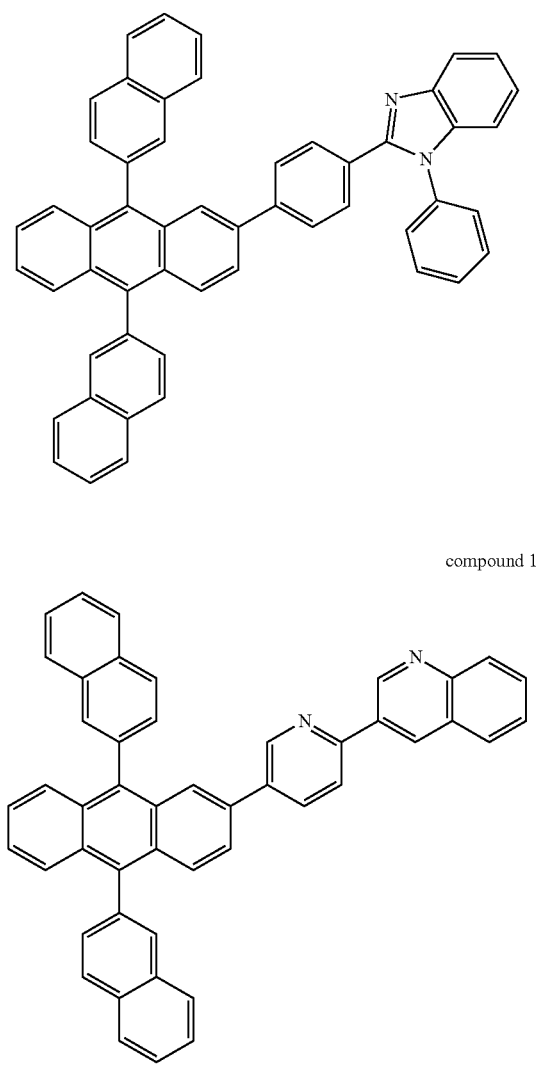
compound 101 compound 102

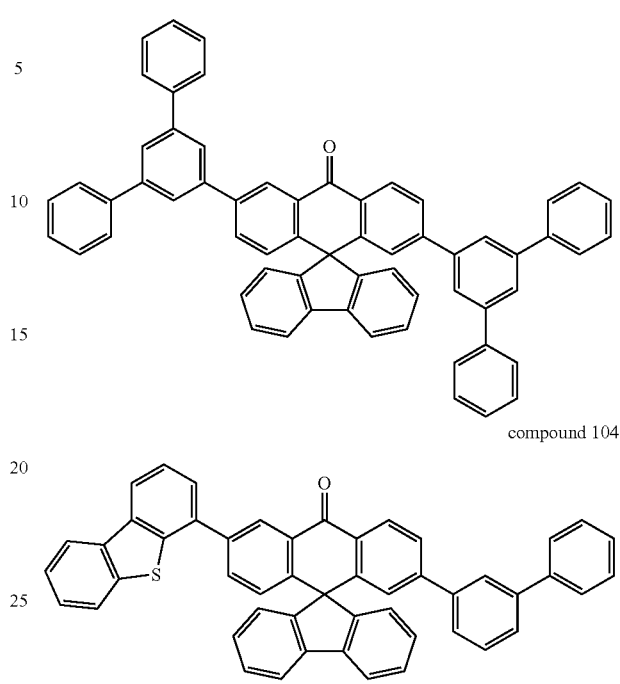
compound 103 compound 104

The second material may improve the luminous efficiency and lifetime of the organic light emitting device 100 by improving the transport property of electrons (the electron transport property). For example, the second material may include at least one selected from a pyrazine derivative represented by a formula 2a and a triazine derivative represented by a formula 2b.

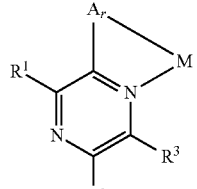

formula 2a

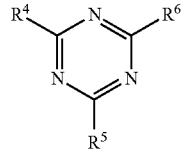

formula 2b

In formula 2a above, $R^1$ may be an alkyl group or an aryl group.

In formula 2a above, $R^2$ may be a hydrogen atom, an alkyl group or an aryl group, and $R^3$ may be a hydrogen atom or an alkyl group, and $R^2$ and $R^3$ may, optionally, combine to form an alicycle.

In formula 2a above, M is a metal center. M may be a group 9 element or a group 10 element, and Ar may be an arylene group.

In formula 2b above, $R^4$ to $R^6$ may each equally or independently be a hydrogen atom (H), a deuterium atom (D), a fluorine atom (F), a chlorine atom (Cl), a bromine atom (Br), an iodine atom (I), a carbohydrate (e.g., a CHO based compound), a $N(R^7)_2$, a $N(Ar^5)_2$, a $B(OR^7)_2$, a $B(R^7)_2$, a $B(N(R^7)_2)_2$, a $OSO_2R^7$, a linear $C_1$ to $C_{40}$ alkyl group, a linear $C_1$ to $C_{40}$ alkenyl group, a linear $C_1$ to $C_{40}$ alkoxy group or a linear $C_1$ to $C_{40}$ thio alkoxy group (each of the foregoing groups may be substituted with or bonded to one or more radical $R^7$, and one or more non-adjacent $CH_2$ group may be substituted with or $R^7C=CR^7$, $C\equiv C$, $Si(R^7)_2$, $Ge(R^7)_2$, $Sn(R^7)_2$, $C=O$, $C=Se$, $C=NR^7$, $P(=O)(R^7)$, SO, $SO_2$, $NR^7$, O, S or $CONR^7$, and one or more hydrogen atom may be substituted with CN or $NO_2$), $R^4$ to $R^6$ may be an aromatic or a heteroaromatic ring system including $C_5$ to $C_{60}$ aromatic ring atoms (each of the aromatic ring atoms may be substituted with or bonded to one and more radical $R^7$), $R^4$ to $R^6$ may be an aryloxy group, heteroaryloxy group or spirobifluorene group including $C_5$ to $C_{60}$ aromatic ring atoms (each of the aromatic ring atoms may be substituted with or bonded to one and more radical $R^7$), or $R^4$ to $R^6$ may be a combination of any of the foregoing.

Two or more adjacent $R^4$ to $R^6$ may, optionally, combine to form a ring system including a single aromatic or aliphatic ring or a plurality of aromatic or aliphatic rings.

$Ar^5$ above may be an aromatic or a heteroaromatic ring system including $C_5$ to $C_{30}$ aromatic ring atoms (each of the aromatic ring atoms may be substituted with or bonded to one and more radical $R^7$).

$Ar^5$ above may be bonded to nitrogen (N) equally or independently via nitrogen (N), phosphorus (P) or boron (B), for example, by a bridge selected from a single bond, $B(R^7)$, $C(R^7)_2$, $Si(R^7)_2$, $C=O$, $C=NR^7$, $C=C(R^7)_2$, O, S, S=O, $SO_2$, $N(R^7)$, $P(R^7)$ and $P(=O)R^7$.

$R^7$ above may equally or independently be an aromatic hydrocarbon radical of $C_1$ to $C_{20}$, an aliphatic hydrocarbon radical of $C_1$ to $C_{20}$, a heteroaromatic hydrocarbon radical of $C_1$ to $C_{20}$ or an aromatic and heteroaromatic hydrocarbon radical of $C_1$ to $C_{20}$ (each hydrogen atom of $R^7$ may be substituted with a fluorine atom).

Two or more adjacent $R^7$ may, optionally, combine to form a ring system including a single aromatic or aliphatic ring or a plurality of aromatic or aliphatic rings.

For example, in an embodiment of the second material, the pyrazine derivative represented by formula 2a or formula 2b may be a compound 201 or a compound 202, which are represented by the following formulas. However, the second material is not limited thereto. The second material may be any suitable material for improving the luminous efficiency and the lifetime of the organic light emitting device 100.

compound 201

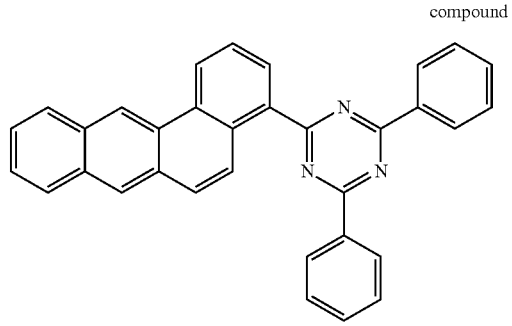

compound 202

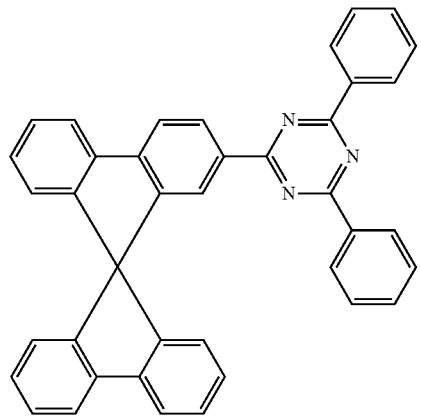

The third material may reduce a driving voltage of the organic light emitting device 100. For example, the third material may include at least one of an alkali metal and a complex of the alkali metal. For example, the third material may include a lithium quinolate ("LiQ") or a compound 301 ("LtBTZ"), which are shown below. However, the third material is not limited thereto.

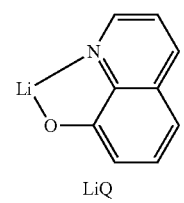

LiQ compound 301

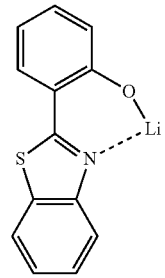

The third material can transport (or easily transport) electrons received by the electron injection layer 170, with low driving voltage, and can block holes that flow from the hole transport layer 130 (or reduce the flow of holes from the hole transport layer 130).

In some embodiments, the first electron transport layer 150 has hybrid elements including the first material to improve the thermal stability, the second material to improve the luminous efficiency, and the third material to reduce the driving voltage of the organic light emitting device 100. In such embodiments, the thermal stability of the organic light emitting device 100 is improved without reduction (or without undesirable reduction) of the luminous efficiency and the lifetime thereof.

In an example embodiment, a content (or amount) ratio of the first material, the second material and the third material is not limited. However, the thermal stability, the luminous efficiency and the lifetime can be adjusted (or controlled) by controlling the content (or amount) ratio of the first material, second material and third material. For example, in order to maintain high thermal stability, the first electron transport layer 150 may include the first material in a range of about 20 wt % to about 80 wt %, based on the total weight of the first electron transport layer. In order to improve the transport property of electrons and reduce the driving voltage, the first electron transport layer 150 may, for example, include the third material in a range of about 15 wt % to about 70 wt %. For example, the first electron transport layer 150 may include the first material, the second material and the third material at a weight ratio of first material:second material:third material of about 40:10:50.

In an example embodiment, the first electron transport layer 150 can improve the thermal stability of the organic light emitting device 100, according to a thickness thereof. However, an excessively thick first electron transport layer 150 may increase the driving voltage of the organic light emitting device 100. For example, the first electron transport layer 150 may have a suitable (or proper) thickness of about 25□ to about 200□, in order to avoid an undesirable (or unsuitable) increase of the driving voltage of the organic light emitting device.

The second electron transport layer 160 may improve the luminous efficiency and the lifetime of the organic light emitting device 100. In one example embodiment, the second electron transport layer 160 may include a fourth material to improve the luminous efficiency and the lifetime. In another example embodiment, the second electron transport layer 160 may further include a fifth material to reduce the driving voltage.

The fourth material may include at least one selected from a pyrazine derivative and a triazine derivative. The pyrazine derivative and the triazine derivative of the fourth material are substantially the same as the pyrazine derivative and the triazine derivative as described above with respect to the second material included in the first electron transport layer 150.

In one example embodiment, the fourth material of the second electron transport layer 160 and the second material of the first electron transport layer 150 may include substantially the same compound. In such an embodiment, a process of manufacturing the first electron transport layer 150 and the second electron transport layer 160 can be simple (or straightforward).

In another example embodiment, each of the fourth material of the second electron transport layer 160 and the second material of the first electron transport layer 150 may include a different material. However the function of the fourth material of the second electron transport layer for improving the luminous efficiency and the lifetime of the organic light emitting device 100 is substantially the same as the function of the second material of the first electron transport layer.

The fifth material of the second electron transport layer 160 may include at least one selected from an alkali metal and a complex of the alkali metal. In one example embodiment, the fifth material including an alkali metal or a complex of the alkali metal that is substantially the same as the third material of the first electron transport layer 150. In such an embodiment, the first electron transport layer 150 and the second electron transport layer 160 may be easily formed. In another example embodiment, each of the fifth material and the third material may include a different alkali metal or a different complex of the alkali metal. The second electron transport layer 160 may include the fifth material in a range of about 30 wt % to about 70 wt %, based on the total weight of the second electron transport layer. For example, the second electron transport layer 160 may include the fifth material in a range of about 45 wt % to about 55 wt %, based on the total weight of the second electron transport layer.

The second electron transport layer 160 may have a thickness of about 100□ to about 800□, in order to reduce the driving voltage while maintaining the luminous efficiency and the lifetime. For example, the second electron transport layer 160 may have a thickness of about 150□ to about 500□.

The electron injection layer 170 may be on (e.g., directly on or disposed on) the second electron transport layer 160. When the second electrode 180 is a cathode, the electron injection layer 170 has a function of injecting electrons easily from the second electrode 180. The electron injection layer 170 may be omitted in some embodiments.

The electron injection layer 170 may include a lithium fluoride (LiF), a sodium chloride (NaCl), a barium fluoride (BaF), a caesium fluoride (CsF), a lithium oxide (Li2O), an aluminum oxide (Al2O3), a barium oxide (BaO), a fullerene (C60), or a combination thereof, for example, but the electron injection layer is not limited thereto. The electron injection layer 170 may have a thickness of about 1□ to about 100□. In such an embodiment, the electron injection layer can provide the sufficient (or suitable) electron injection property without increasing (or undesirably increasing) the driving voltage.

Figure 4:
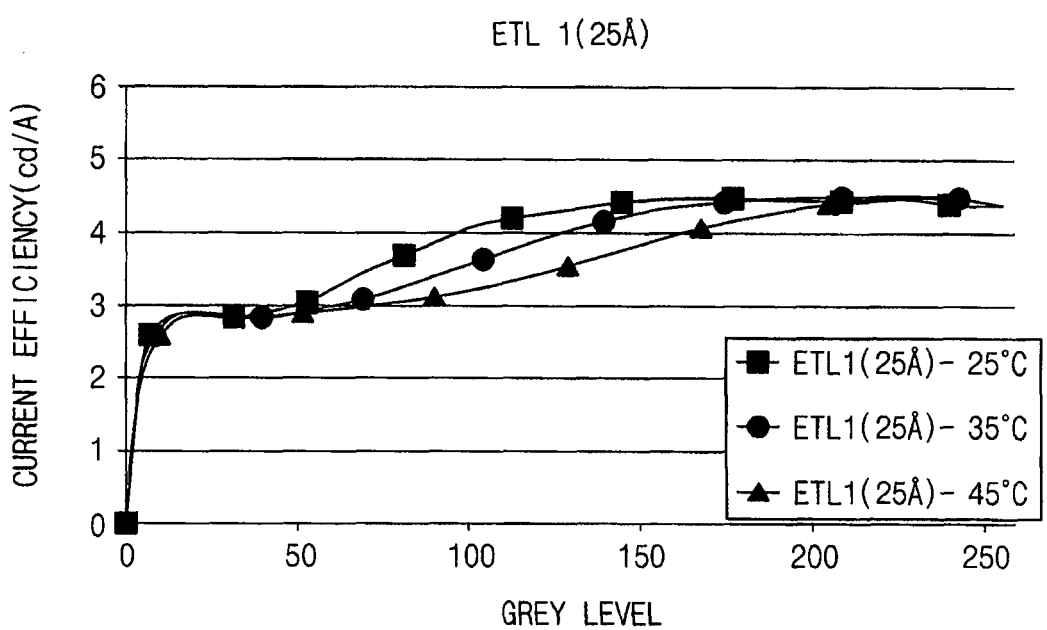
FIG. 4 is a graph illustrating a change of luminous efficiency, at 25° C., 35° C. and 45° C., according to grey level, of an organic light emitting device including a first electron transport layer having a thickness of 25□ in accordance with an example embodiment of the present invention.
Figure 5:
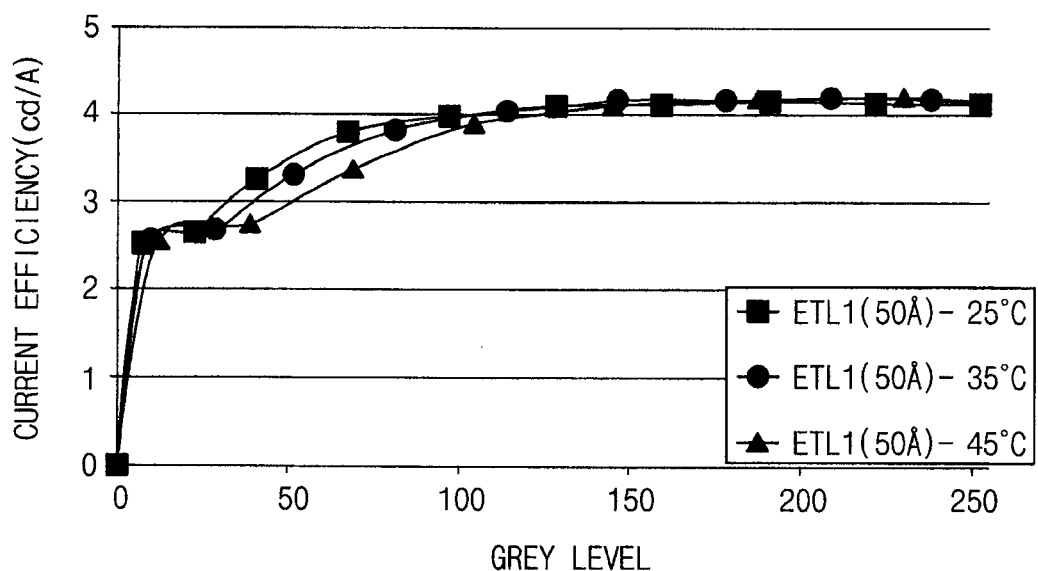
FIG. 5 is a graph illustrating a change of luminous efficiency at 25° C., 35° C. and 45° C., according to grey level, of an organic light emitting device including a first electron transport layer having a thickness of 50□ in accordance with an example embodiment of the present invention.
Figure 6:
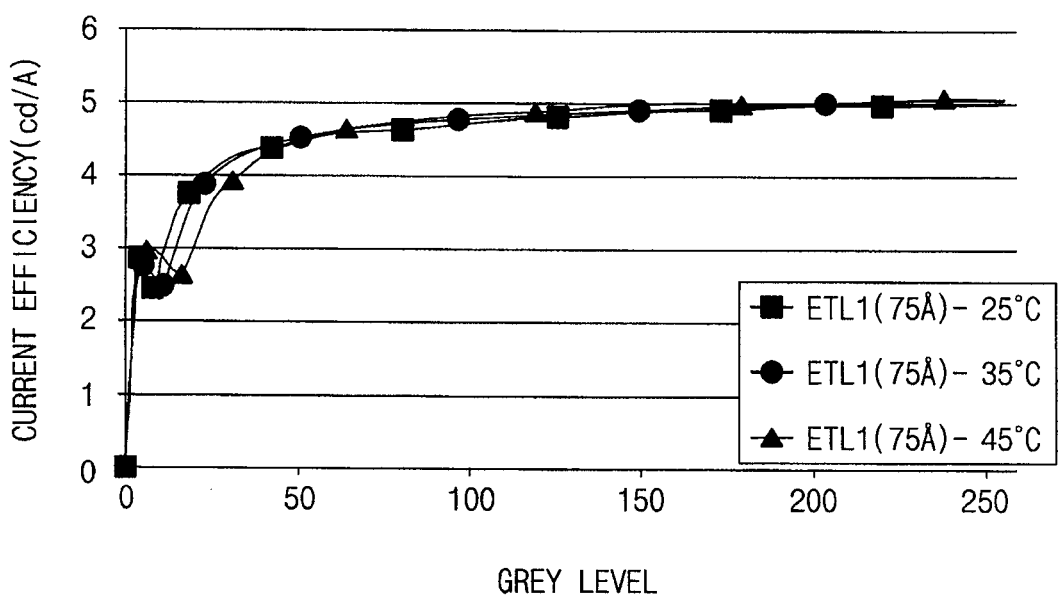
FIG. 6 is a graph illustrating a change of luminous efficiency at 25° C., 35° C. and 45° C., according to grey level, of an organic light emitting device including a first electron transport layer having a thickness of 75□ in accordance with an example embodiment of the present invention.

FIGS. 4 to 6 are graphs illustrating a luminous efficiency and thermal stability of the organic light emitting device 100 including the first electron transport layer 150 and the second electron transport layer 160, in accordance with example embodiments of the present invention.

For example, FIG. 4 is a graph illustrating a change of luminous efficiency at 25° C., 35° C. and 45° C., according to grey level, of an organic light emitting device including a first electron transport layer having a thickness of 25□ in accordance with an example embodiment of the present invention. FIG. 5 is a graph illustrating a change of luminous efficiency at 25° C., 35° C. and 45° C., according to grey level, of an organic light emitting device including a first electron transport layer having a thickness of 50□ in accordance with an example embodiment of the present invention. FIG. 6 is a graph illustrating a change of luminous efficiency at 25° C., 35° C. and 45° C., according to grey level, of an organic light emitting device including a first electron transport layer having a thickness of 75□ in accordance with the example embodiment of the present invention.

Referring to FIGS. 4 to 6, each result shown in the graphs was taken by measuring the organic light emitting device which includes the first electron transport layer (ETL 1) including (or consisting of) the first material, the second material and the third material at a weight ratio of first material:second material:third material of 40:10:50.

Referring to FIGS. 4 to 6, it can be seen that the thicker the first electron transport layer ETL 1 of the organic light emitting device is, the more reduced the change of the luminous efficiency according to the driving temperature is. In other words, the thicker the first electron transport layer ETL 1 is, the more improved the thermal stability of the organic light emitting device is.

For example, as shown in FIGS. 4 to 6, the organic light emitting device in accordance with an example embodiment of the present invention maintained the luminous efficiency constantly at all grey levels, although the driving temperature had been changed. However, in the case of the organic light emitting device of FIG. 3, which included a single electron transport layer ETL B to improve the luminous efficiency and the lifetime, the luminous efficiency was reduced by raising the driving temperature.

In addition, the luminous efficiency of the organic light emitting device in accordance with an example embodiment of the present invention was generally improved, as compared to the organic light emitting device of FIG. 2, which included a single electron transport layer ETL A to improve the thermal stability, because the first electron transport layer according an example embodiment includes the second material to improve the luminous efficiency, and the second electron transport layer includes the fourth material to improve the luminous efficiency.

Figure 7:
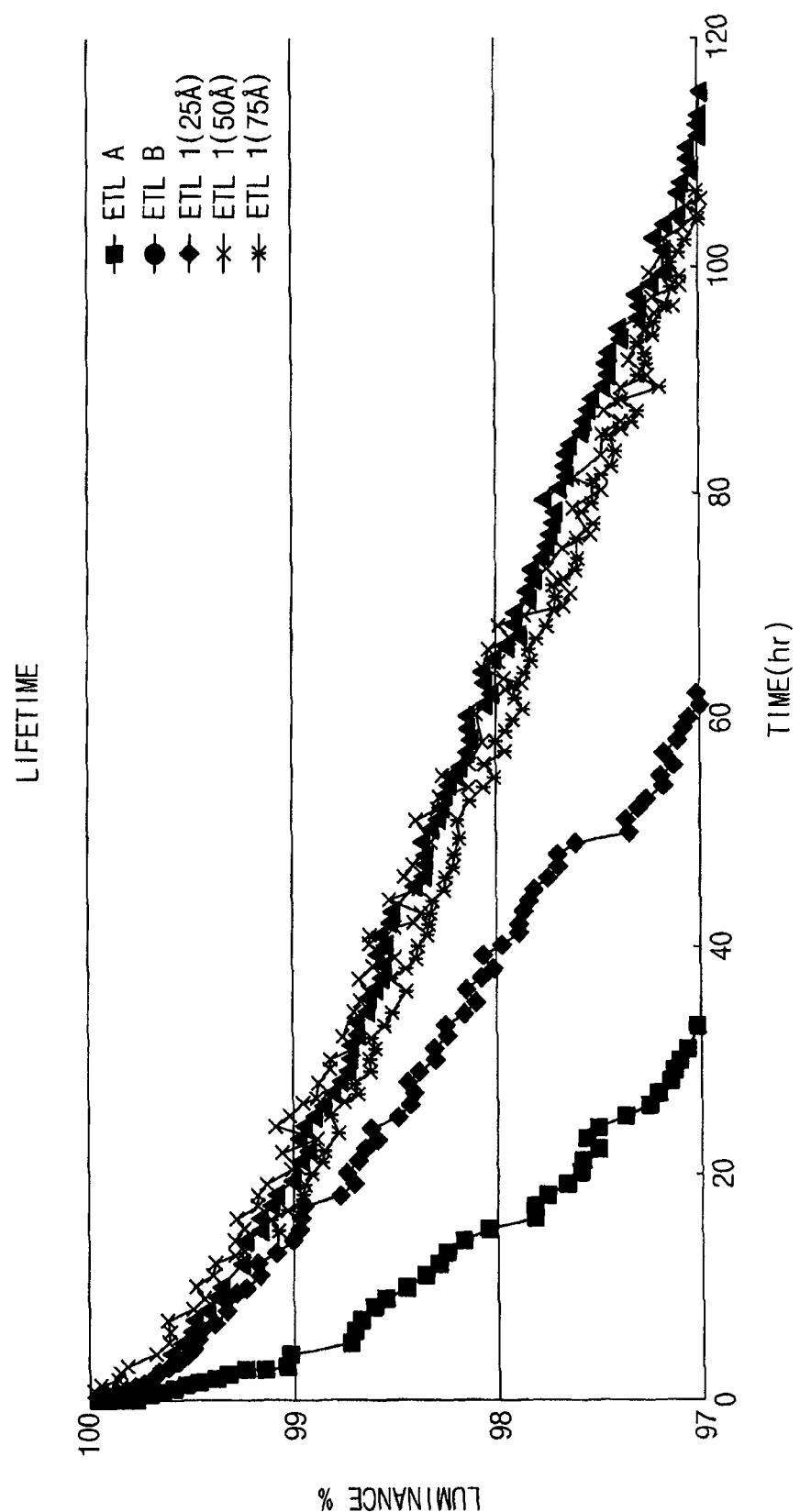
FIG. 7 is a graph illustrating lifetime characteristics of an organic light emitting device including a single electron transport layer for improving a thermal stability, an organic light emitting device including a single electron transport layer for improving a luminous efficiency and the lifetime, and an organic light emitting device including a first electron transport layer and a second electron transport layer in accordance with an example embodiment of the present invention.

FIG. 7 is a graph illustrating lifetime characteristics of an organic light emitting device including a single electron transport layer to improve a thermal stability, an organic light emitting device including a single electron transport layer to improve a luminous efficiency and the lifetime, and an organic light emitting device including a first electron transport layer and a second electron transport layer in accordance with an example embodiment of the present invention.

Herein, "long lifetime" or "advanced lifetime" means that a time for decreasing the luminescence of the organic light emitting device to less than 95%, based on 100% by luminescence of an initial organic light emitting device, is 100 hours or more.

Referring to FIG. 7, it can be seen that the lifetime of the organic light emitting device in accordance with example embodiments of the present invention is more advanced (e.g., longer) than the lifetime of an organic light emitting device including a single electron transport layer ETL A to improve the thermal stability. It can also be seen that the lifetime of the organic light emitting device in accordance with example embodiments of the present invention is more advanced (e.g., longer) than the lifetime of an organic light emitting device including a single electron transport layer ETL B to improve the luminous efficiency and lifetime.

For example, the second electron transport layer of the organic light emitting device in accordance with an example embodiment of the present invention substantially improves the lifetime of the organic light emitting device. For example, when the organic light emitting device includes a thin first electron transport layer ETL 1, which is relatively thinner than a thickness of the second electron transport layer ETL 2, the lifetime of the organic light emitting device is further improved. As illustrated in FIG. 7, the lifetime of the organic light emitting device including a first electron transport layer ETL 1 having a thickness of 25□ is more advanced (e.g., longer) than the lifetime of the organic light emitting device including a first electron transport layer ETL 1 having a thickness of 75□.

As a result, according to an example embodiment, the first electron transport layer 150 may improve the thermal stability of the organic light emitting device 100, and the second electron transport layer 160 may improve the luminous efficiency and the lifetime thereof.

In some embodiments, the organic light emitting device includes the first electron transport layer 150 including three different materials such that the thermal stability thereof is improved. In some embodiments, the organic light emitting device includes the second electron transport layer 160 including two different materials such that the luminous efficiency and lifetime thereof is improved.

Figure 8:
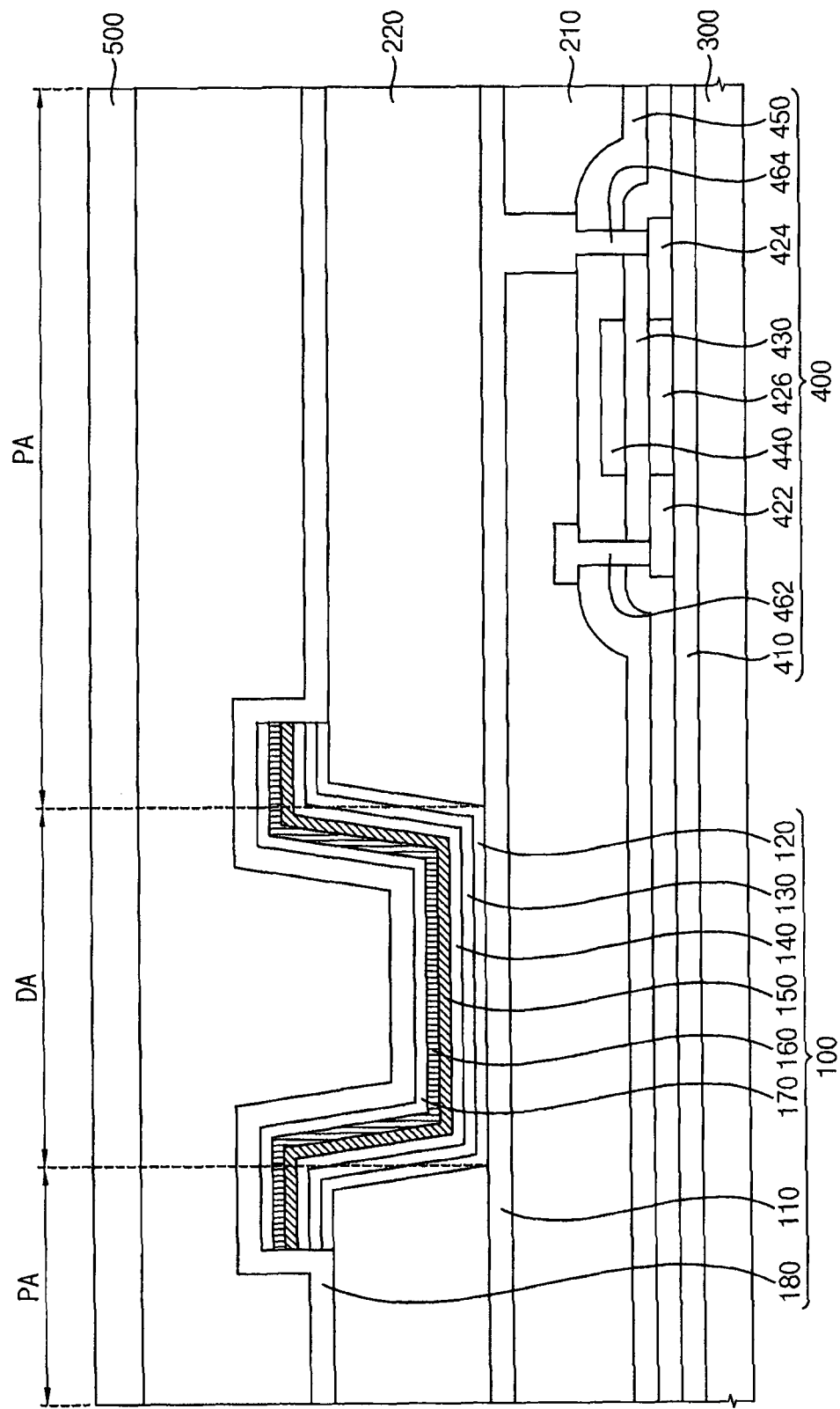
FIG. 8 is a cross-sectional view illustrating an organic light emitting display apparatus in accordance with an example embodiment of the present invention.

FIG. 8 is a cross-sectional view illustrating an organic light emitting display apparatus in accordance with an example embodiment of the present invention.

Referring to FIG. 8, the organic light emitting display apparatus includes a first substrate 300, a switching device 400 on (e.g., directly on or disposed on) the first substrate 300, an organic light emitting device 100 electrically connected to the switching device 400 and a second substrate 500 encapsulating the organic light emitting device 100 (or isolating the organic light emitting device 100 from external environment). The organic light emitting device 100 may have improved luminous efficiency, lifetime and thermal stability.

The first substrate 300 supports the switching device 400 and the organic light emitting device 100. The first substrate 300 may be an inorganic substrate including a glass or a poly-silicon (e.g., polycrystalline silicon). In an example embodiment, the first substrate 300 may be a plastic substrate including a polyethylene terephthalate ("PET"), a polyethylene naphthalate ("PEN"), a polyimide, for example, but the first substrate is not limited thereto. In an example embodiment, the first substrate 300 may be a flexible display substrate including a conductive material such as a metal or other polymer having flexibility.

The switching device 400 is on (e.g., directly on or disposed on) the first substrate 300, and the switching device 400 drives the organic light emitting device 100. For example, the switching device 400 may be a thin film transistor (TFT).

The switching device 400 may include a buffer layer 410, a semiconductor layer 422, 424 and 426, a gate insulation layer 430, a gate electrode 440, an insulating interlayer 450, a source electrode 462 and a drain electrode 464.

The buffer layer 410 may improve a flatness (or surface uniformity) of the first substrate 300, and the buffer layer 410 may release a stress (or strain) produced during a process of forming the switching device 400, and the buffer layer 410 may block impurities from being diffused from the first substrate 300 (or reduce the diffusion of impurities from the first substrate 300). The buffer layer 410 may include an oxide, a nitride or an oxynitride, for example, but the buffer layer is not limited thereto.

The semiconductor layer 422, 424 and 426 is on (e.g., directly on or disposed on) the buffer layer 410. The semiconductor layer 422, 424 and 426 includes a first impurity region 422, a second impurity region 424 and a channel region 426. Each of the first impurity region 422 and the second impurity region 424 may be a source or a drain of the switching device 400.

The semiconductor layer 422, 424 and 426 may include poly-silicon (e.g., polycrystalline silicon), a poly-silicon having an impurity, an amorphous silicon, an amorphous silicon having an impurity, an oxide semiconductor, an oxide semiconductor having an impurity, or a combination thereof, but the semiconductor layer is not limited thereto.

The gate insulation layer 430 is for electrically separating the gate electrode 440 from the semiconductor layer 422, 424 and 426. The gate insulation layer 430 may include an oxide or an organic insulating material. For example, the gate insulation layer 430 may include a silicon oxide, an aluminum oxide (AlOx), a titanium oxide (TiOx), a benzo-cyclo-butene (BCB)-based resin, an acryl-based resin, but the gate insulation layer is not limited thereto.

The gate electrode 440 is on (e.g., directly on or disposed on) the gate insulation layer 430 and overlaps the semiconductor layer 422, 424 and 426. For example, the gate electrode 440 may include a metal, a metal nitride, a conductive metal oxide, and/or a transparent conductive material, but the gate electrode is not limited thereto. The gate electrode 440 may have a single-layered structure or a multi-layered structure including the metal, the metal nitride, the conductive metal oxide and/or the transparent conductive material.

The insulating interlayer 450 is on (e.g., disposed on) the first substrate 300 in order to cover the gate electrode 440 and the gate insulation layer 430. For example, the insulating interlayer 450 may include an oxide, a nitride, an oxynitride, an organic insulating material, or a combination thereof, but the insulating interlayer is not limited thereto.

The insulating interlayer 450 includes holes for exposing portions of the first impurity region 422 and the second impurity region 424. The source electrode 462 is electrically connected to the first impurity region 422 through one of the holes, and the drain electrode 464 is electrically connected to the second impurity region 424 through another one of the holes, and the source electrode 462 and the drain electrode 464 are on (e.g., directly on or disposed on) the insulating interlayer 450. For example, the source electrode 462 and the drain electrode 464 may each independently include a metal, a metal nitride, a conductive metal oxide, a transparent conductive material or a combination thereof, but the source electrode and the drain electrode are not limited thereto. The source electrode 462 and the drain electrode 464 may have a single-layered structure or a multi-layered structure including the metal, the metal nitride, the conductive metal oxide, and/or the transparent conductive material.

The organic light emitting device is electrically connected to the switching device 400 and is on (e.g., directly on or disposed on) the first substrate 300. In an example embodiment, an insulation layer 210 may be between (e.g., directly contacting both or disposed between) the organic light emitting device 100 and the switching device 400, thereby separating the organic light emitting device 100 and the switching device 400. The insulation layer 210 may have a hole for exposing a portion of drain electrode 464 of the switching device 400 (e.g., a hole for the drain electrode 464 to pass through), and the organic light emitting device 100 may be electrically connected to the switching device 400 through the hole. In another example embodiment, the organic light emitting device 100 may be electrically connected to the switching device 400 without insulation layer 210. In such an embodiment, the organic light emitting device 100 may be on (e.g., directly on or disposed on) the same layer with the switching device 400.

The insulation layer 210 flattens (or improves a surface uniformity of) an upper surface of the switching device 400, and the insulation layer 210 may protect the switching device 400 by electrically insulating the switching device 400.

For example, the insulation layer 210 may include a benzo-cyclo-butene-based resin, an olefin-based resin, a polyimide-based resin, an acryl-based resin, a polyvinyl-based resin, a siloxane-based resin or a combination thereof, for example, but the insulation layer is not limited thereto.

In an example embodiment, the insulation layer 210 may have a substantially flat surface formed by a planarization process. For example, the insulation layer 210 may be planarized by a chemical mechanical polishing ("CMP"), and/or an etch-back.

In another example embodiment, the insulation layer 210 may include a material having a self planarizing property.

The organic light emitting device 100 includes a first electrode 110 electrically connected to the switching device 400, a hole injection layer 120 on (e.g., directly on or disposed on) the first electrode 110, a hole transport layer 130, an organic light emitting layer 140, a first electron transport layer 150, a second electron transport layer 160, an electron injection layer 170 and a second electrode 180.

The first electrode 110 is electrically connected to the switching device 400. For example, when the switching device 400 includes an N-channel transistor, the first electrode 110 may be a cathode. Alternatively, when the switching device 400 includes a P-channel transistor, the first electrode 110 may be an anode.

The first electrode 110 and the second electrode 180 may be a reflective electrode, a transmitting electrode or a transflective electrode, according to a direction of light emission of the organic light emitting device 100. Detailed descriptions of the foregoing were already described above with respect to FIG. 1. Thus, duplicative descriptions thereof will be omitted here.

In one example embodiment, the organic light emitting device 100 may include a pixel definition layer 220 on (e.g., directly on or disposed on) the first electrode 110. The pixel definition layer 220 includes an opening exposing a portion of the first electrode 110, and the organic light emitting layer 140 is located at (or disposed in) the opening in order to form a pixel. Thus, an opening area is defined as a display area DA, and an outside area surrounding the display area DA is defined as a peripheral area PA. In another example embodiment, the pixel definition layer 220 may be omitted.

For example, the pixel definition layer 220 may include a commercial polymer (e.g. a poly methyl methacrylate ("PMMA") and/or a polystyrene ("PS")), a polymer derivative having a phenol group, an acryl-based polymer, an imide-based polymer, an aryl-ether-based polymer, an amide-based polymer, a fluorine-based polymer, a p-xylene-based polymer, a vinyl-alcohol-based polymer or a blend thereof, for example, but the pixel definition layer is not limited thereto.

The hole injection layer 120, the hole transport layer 130, the first electron transport layer 150, the second electron transport layer 160 and the electron injection layer 170 may be located at (or disposed in) the opening area of the pixel definition layer 220.

A stacking order of the organic layers listed above may be changed in accordance with an electrical polarity of the first electrode 110. For example, when the first electrode 110 is an anode, the hole injection layer 120, the hole transport layer 130, the organic light emitting layer 140, the first electron transport layer 150, the second electron transport layer 160, the electron injection layer 170 and the second electrode 180 are stacked sequentially on the first electrode 110.

Alternatively, when the first electrode 110 is a cathode, the electron injection layer 170, the second electron transport layer 160, the first electron transport layer 150, the organic light emitting layer 140, the hole transport layer 130, the hole injection layer 120 and the second electrode 180 are stacked sequentially on the first electrode 110.

The hole injection layer 120, the hole transport layer 130, the organic light emitting layer 140, the first electron transport layer 150, the second electron transport layer 160 and the electron injection layer 170 are substantially the same as the corresponding layer of the organic light emitting device of FIG. 1. Thus, duplicative descriptions thereof will be provided again here.

The second substrate 500 is on (e.g., directly on or disposed on) the organic light emitting device 100, in order to encapsulate the organic light emitting device (or isolate the organic light emitting device 100 from the external environment). The second substrate 500 may have chemical stability (e.g., may be chemically stable) to protect the organic light emitting device 100 from external moisture and gas, and the second substrate 500 may have advanced transparency (e.g., high light transmittance) for transmitting a light emitted by the organic light emitting device 100. For example, the second substrate 500 may include a glass, a transparent metal film, an organic insulation layer, an inorganic insulation layer, but the second substrate is not limited thereto.

According to an example embodiment, the organic light emitting display apparatus includes the organic light emitting device 100 which has improved thermal stability, improved luminous efficiency and long lifetime. Accordingly, a stability and a durability of the organic light emitting display apparatus is improved, and the organic light emitting display apparatus that is less sensitive to driving temperature and capable of displaying high quality images for a long time is provided.

FIGS. 9A to 9F are cross-sectional views illustrating an embodiment of a method of manufacturing the organic light emitting display apparatus of FIG. 8.

Figure 9A:
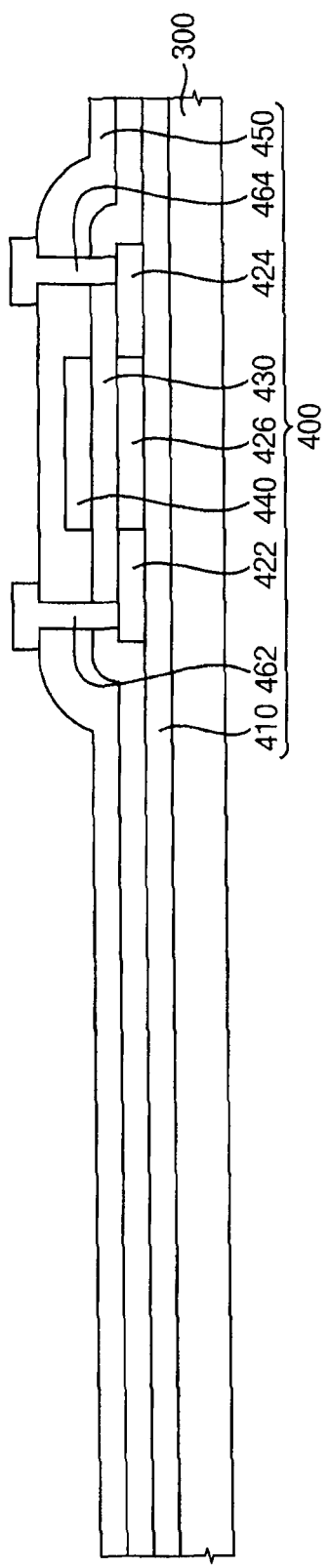

Referring to FIGS. 9A to 9F, the switching device 400 may be formed on the first substrate 300, as illustrated in FIG. 9A. For example, the switching device 400 may be configured to include a thin film transistor, and the switching device 400 may be formed by any suitable manufacturing method for a switching device.

For example, a buffer layer 410 may be formed on the first substrate 300 by a chemical vapor deposition ("CVD") process, a plasma-enhanced chemical vapor deposition ("PECVD") process, a high-density-plasma chemical vapor deposition ("HDP CVD") process, a spin coating process, a thermal oxidation process or a printing process, for example, but the method of forming the buffer layer is not limited thereto.

A semiconductor layer 422, 424 and 426 may be formed on the buffer layer 410 by a chemical vapor deposition process, a plasma-enhanced chemical vapor deposition process, a spin coating process or a printing process, for example, but the method of forming the semiconductor layer is not limited thereto.

After patterning the semiconductor layer 422, 424 and 426, the gate insulation layer 430 may be formed on the buffer layer 410, in order to cover the semiconductor layer 422, 424 and 426. For example, the gate insulation layer 430 may be formed by a sputtering process, a chemical vapor deposition process, an atomic layer deposition ("ALD") process, a high-density-plasma chemical vapor deposition process, a spin coating process or a printing process, but the method of forming the gate insulation layer is not limited thereto.

After depositing a first conductive layer, the gate electrode 440 may be formed by patterning the first conductive layer. The gate electrode 440 may be formed on the gate insulation layer 430, to overlap (or be overlapped with) the semiconductor layer 422, 424, and 426. The gate electrode 440 may be formed by a sputtering process, a chemical vapor deposition process, an atomic layer deposition process, a spin coating process, a vacuum deposition process, a pulsed laser deposition ("PLD") process or a printing process, for example, but the method of forming the gate electrode is not limited thereto.

A first impurity region 422 and a second impurity region 424 may be formed by doping impurities at (or into) the semiconductor layer 422 and 424 using the gate electrode 430 as a mask.

For example, the doping may be performed by an ion implantation process. A type of the switching device 400 is determined by the composition of the impurity. For example, a P-type switching device 400 may be formed by doping group 3 atoms such as boron, gallium or indium, but the impurity is not limited thereto. Alternatively, an N-type switching device 400 may be formed by doping group 5 atoms such as antimony, arsenic or phosphorus, but the impurity is not limited thereto.

The insulating interlayer 450 may cover the gate electrode 440 and may be formed on the gate insulation layer 430. The insulating interlayer 450 may be formed by a sputtering process, a chemical vapor deposition process, a plasma-enhanced chemical vapor deposition process, an atomic layer deposition process, a spin coating process, a vacuum deposition process, a pulsed laser deposition process or a printing process, for example, but the method of forming the insulating interlayer is not limited thereto.

Holes exposing portions of the first impurity region 422 and the second impurity region 424 may be formed. For example, the holes may be formed by photolithography. After depositing a second conductive layer filling the holes, a source electrode 462 and a drain electrode 464 may be formed by patterning the second conductive layer. The second conductive layer may be formed by a sputtering process, a chemical vapor deposition process, a plasma-enhanced chemical vapor deposition process, an atomic layer deposition process, a spin coating process, a vacuum deposition process, a pulsed laser deposition process or a printing process, for example, but the method of forming the second conductive layer is not limited thereto.

In addition, a gate line may be formed on a portion of the gate insulation layer 430 at the same time (or substantially the same time, for example, concurrently or simultaneously) with forming the gate electrode 440. A data line may be formed on a portion of the insulating interlayer 450 at the same time (or substantially the same time, for example, concurrently or simultaneously) with forming the source electrode 462 and the drain electrode 464. Methods of forming the gate line and the data line are substantially the same as the methods of forming the gate electrode 440, the source electrode 462 and the drain electrode 464.

Figure 9B:
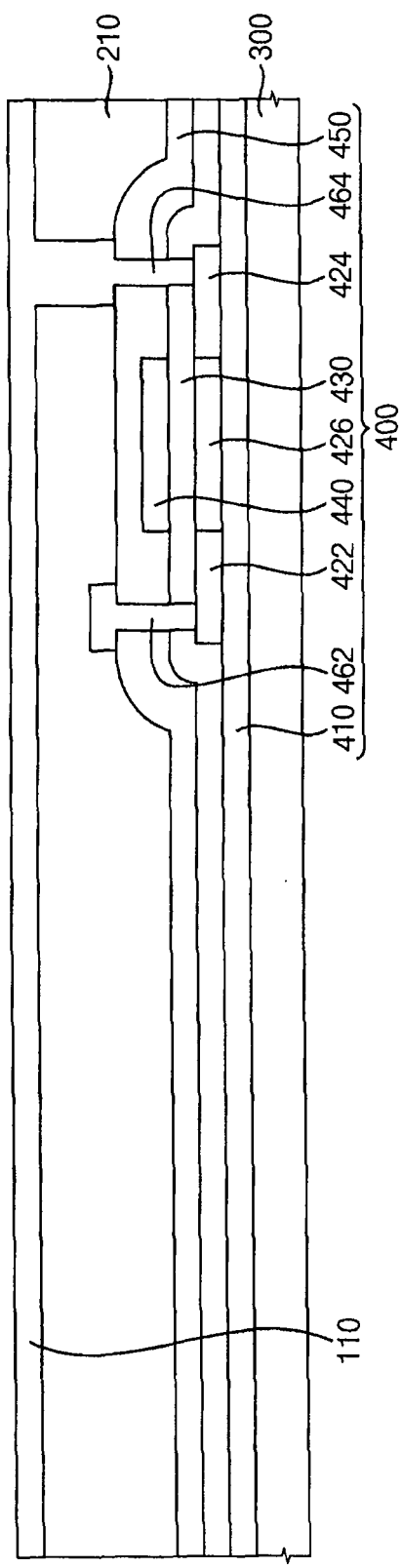

As illustrated in FIG. 9B, in an example embodiment, the insulation layer 210 may be formed to cover the switching device 400. For example, the insulation layer 210 may be formed by a spin coating process, a printing process or a vacuum deposition process, but the method of forming the insulation layer is not limited thereto. In one example embodiment, the insulation layer 210 may be planarized by a chemical mechanical polishing or an etch-back, for example, but the method of planarizing the insulation layer is not limited thereto.

In another example embodiment, the insulation layer 210 may be formed with a material having a self planarizing property. As a result, the insulation layer 210 may have a flat surface.

In an example embodiment, a hole that exposes a portion of the drain electrode 464 may be formed by partially etching the insulation layer 210. For example, the hole may be formed by a photolithography process, but the method of forming the hole is not limited thereto. After forming the hole, a third conductive layer is deposited to fill the hole, and a first electrode 110 may be formed by patterning the third conductive layer.

The first electrode 110 may be formed with a metal or an alloy thereof having high reflectivity, in order to be a reflective electrode. Alternatively, the first electrode 110 may be formed with a transparent conductive material having high transmittance, in order to be a transmitting electrode.

The third conductive layer may be formed by a sputtering process, a printing process, a spray process, a chemical vapor deposition process, an atomic layer deposition process, a vacuum deposition process or a pulsed laser deposition process, for example, but the method of forming the third conductive layer is not limited thereto. The first electrode 110 may be formed by a photolithography process, for example, but the method of forming the first electrode is not limited thereto.

Figure 9C:
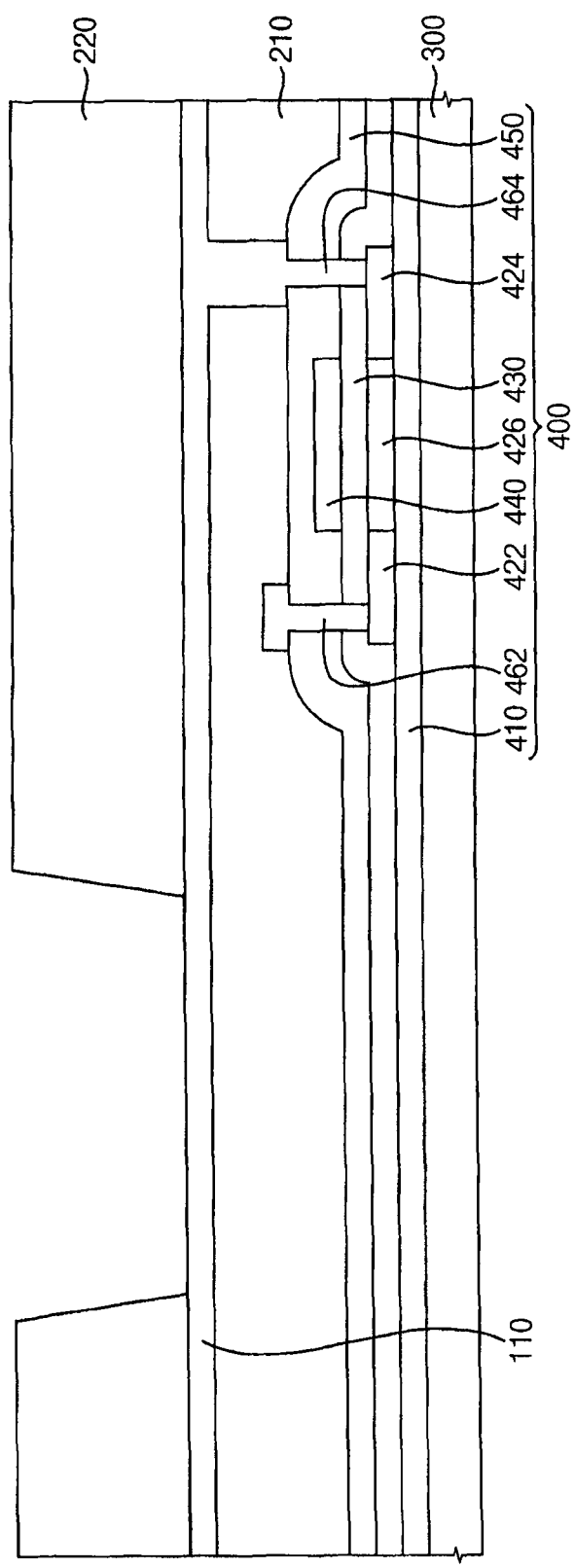

As illustrated in FIG. 9C, in an example embodiment, a pixel definition layer 220 may be formed to cover the first electrode 110. The pixel definition layer 220 may be formed by a spin coating process, a printing process or a vacuum deposition process, for example, but the method of forming the pixel definition layer is not limited thereto.

The pixel definition layer may be formed with an insulating material such as a commercial polymer (e.g. poly methyl methacrylate and/or polystyrene), a polymer derivative having a phenol group, an acryl-based polymer, an imide-based polymer, an aryl-ether-based polymer, an amide-based polymer, a fluorine-based polymer, a p-xylene-based polymer, a vinyl-alcohol-based polymer or a blend thereof, for example, but the pixel definition layer is not limited thereto.

An opening exposing a portion of the first electrode 110 may be formed by an etching process. For example the opening may be formed by a photolithography, but the method of forming the opening is not limited thereto.

Figure 9D:
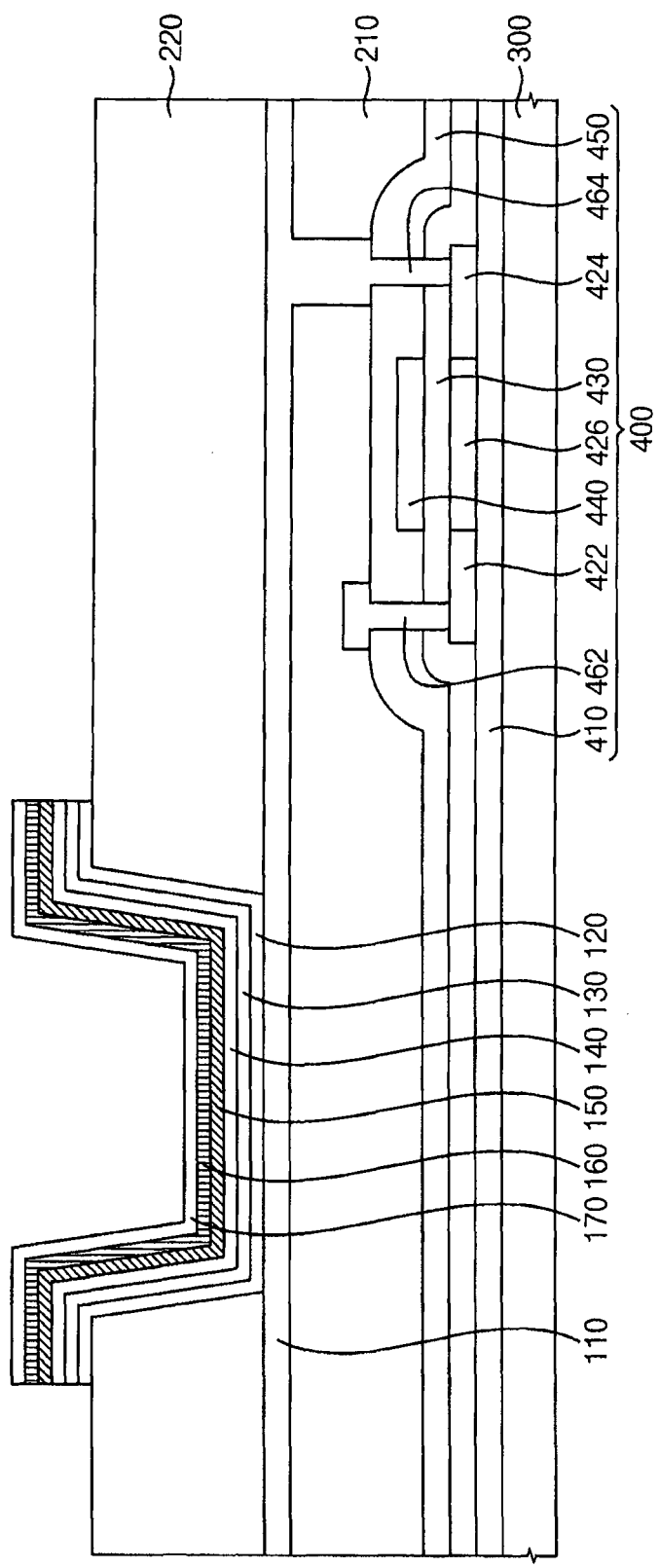

As illustrated in FIG. 9D, the hole injection layer 120 may be formed on the first electrode 110. For example, the hole injection layer 120 may be formed on a portion of the first electrode 110 exposed by the opening of the pixel definition layer 220.

The hole injection layer 120 may be formed by a deposition process, a mask sputtering process, a photoresist process, a printing process, an inkjet process, a spin coating process, a casting or a Langmuir-Blodget process (LB process), for example, but the method of forming the hole injection layer is not limited thereto. Herein, the deposition process may include a sputtering process, a chemical vapor deposition process, a pulsed laser deposition process, a vacuum deposition process, an atomic layer deposition process, for example, but the deposition process is not limited thereto.

For example, the hole injection layer 120 may be formed by adhering a fine metal mask ("FMM") exposing the opening area to the pixel definition layer 220, and depositing the hole injection layer by the vacuum deposition using the hole injection material, but the method of forming the hole injection layer is not limited thereto.

The vacuum deposition may be performed by selecting a suitable (or proper) condition from a vacuum in a range of about 10-8 torr to about 10-3 torr, a deposition temperature in a range of about 100° C. to about 500° C. and a deposition rate in a range of about 0.01 □/sec to about 100 □/sec. The hole injection material is substantially the same as the hole injection material included in the hole injection layer 120 of the organic light emitting device 100 of FIG. 1.

A hole transport layer 130 and an organic light emitting layer 140 may be sequentially formed on the hole injection layer. The hole transport layer 130 and the organic light emitting layer 140 may be formed by substantially the same method as the method of forming the hole injection layer 120. Each of the hole transport layer 130 and the organic light emitting layer 140 may be formed with a component material corresponding to the respective materials described above with respect to the hole transport layer 130 and the organic light emitting layer 140 of the organic light emitting device 100 of FIG. 1.

A first electron transport layer 150 and a second electron transport layer 160 may be formed on the organic light emitting layer 140.

In one example embodiment, the first electron transport layer 150 and the second electron transport layer 160 may be formed to be a laminated layer by forming the first electron transport layer 150 on the organic light emitting layer 140 and forming the second electron transport layer 160 on the first electron transport layer 150.

In another example embodiment, the first electron transport layer 150 and the second electron transport layer 160 may be formed to be a laminated layer by forming the second electron transport layer 160 on the organic light emitting layer 140 and forming the first electron transport layer 150 on the second electron transport layer 160.

The first electron transport layer 150 may be formed with a first material, a second material and a third material. The first material, the second material and the third material are substantially the same as a first material for improving a thermal stability, a second material for improving a luminous efficiency and a third material for reducing a driving voltage as described above with respect to the first electron transport layer 150 of the organic light emitting device of FIG. 1.

The first electron transport layer 150 may be formed by a deposition process, a mask sputtering process, a photoresist process, a printing process, an inkjet process, a spin coating process, a casting process or a Langmuir-Blodget process, for example, but the method of forming the first electron transport layer 150 is not limited thereto. Herein the deposition process may include a sputtering process, a chemical vapor deposition process, a pulsed laser deposition process, a vacuum deposition process or an atomic layer deposition process, for example, but the deposition process is not limited thereto.

Figure 10:
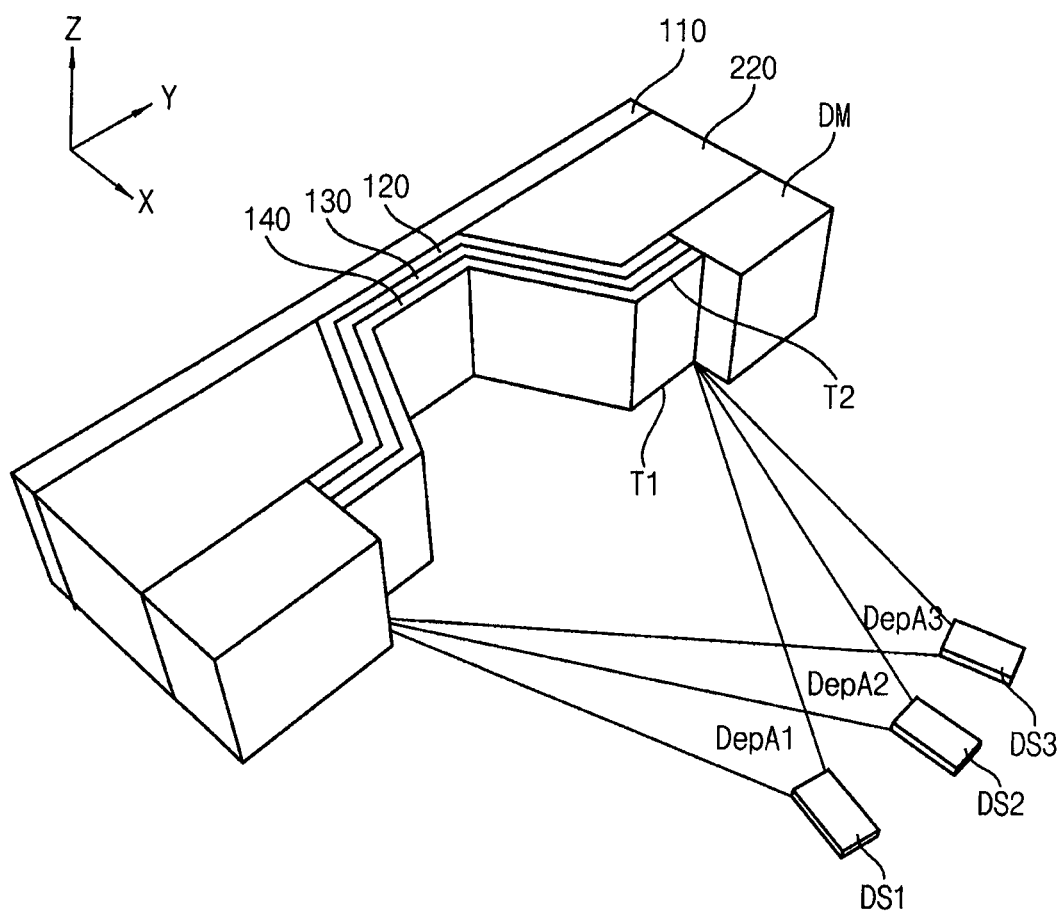
FIG. 10 is a perspective view illustrating an embodiment of a method of forming a first electron transport layer of the organic light emitting display apparatus of FIG. 8.

FIG. 10 is a perspective view illustrating an example of forming a first electron transport layer of the organic light emitting display apparatus of FIG. 8.

Referring to FIG. 10, in an example embodiment, the first electron transport layer 150 may be formed by co-depositing the first material, the second material and the third material. For example, the co-deposition may be performed by a method which includes firstly, preparing a first deposition source DS1 for emitting the first material, a second deposition source DS2 for emitting the second material and a third deposition source DS3 for emitting the third material, secondly, arranging the first deposition source DS1, the second deposition source DS2 and the third deposition source DS3 to overlap a first deposition area DepA1 of the deposition of the first material, a second deposition area DepA2 of the deposition of the second material and a third deposition area DepA3 of the deposition of the third material, and thirdly (or finally), depositing the first material, the second material and the third material while moving a respective aim of the first deposition source DS1, the second deposition source DS2 and the third deposition source DS3 from a first terminal T1 to a second terminal T2 of the organic light emitting layer 140.

In such an example, a deposition amount and a deposition ratio of the first material, the second material and the third material may be controlled by controlling the emitting amount of (e.g., the amount emitted from) the first deposition source DS1, the second deposition source DS2 and the third deposition source DS3. A thickness of the first electron transport layer 150 may be controlled by controlling a respective moving velocity of the first deposition source DS1, the second deposition source DS2 and the third deposition source DS3, or by controlling a number of rounds (e.g., passes or loops) moving between the first terminal T1 and the second terminal T2.

The terms "first terminal T1" and "second terminal T2" refer to boundaries defining an area in which the first electron transport layer 150 is deposited (e.g., an area between dams DM). For example, when the deposition is performed toward (or along) a z direction, the first terminal T1 may be a starting point of deposition and the second terminal T2 may be an ending point of deposition, as illustrated in FIG. 10.

In an example embodiment, the first electron transport layer 150 may be formed by forming a first mixture which contains the first material, the second material and the third material by a suitable (or proper) weight ratio, and depositing the first mixture as a first mixture layer.

In such an embodiment, a deposition ratio of the first material, the second material and the third material may be controlled by controlling a mixing ratio of the first mixture. The deposition process may be performed by a sputtering process, a chemical vapor deposition process, a pulsed laser deposition process, a vacuum deposition process or an atomic layer deposition process, for example, but the deposition process is not limited thereto. Alternatively, the first mixture layer may be formed by a mask sputtering process, a photoresist process, a printing process, an inkjet process, a spin coating process, a casting process or a Langmuir-Blodget process, for example, but the method of forming the first mixture layer is not limited thereto.

As illustrated in FIG. 9D and FIG. 10, the second electron transport layer 160 may be formed with a fourth material and a fifth material. The fourth material and the fifth material are substantially the same as those corresponding to the fourth material to improve the luminous efficiency and to the fifth material to reduce the driving voltage of the organic light emitting device 100 of FIG. 1.

The second electron transport layer 160 may be formed by the same (or substantially the same) method of forming the first electron transport layer 150. In an example embodiment, the fourth material may be substantially the same as the second material of the first electron transport layer 150, and the fifth material may be substantially the same as the third material of the first electron transport layer 150. In such an embodiment, as illustrated in FIG. 10, the second electron transport layer 160 may be formed by using the second deposition source DS2 which was used to form the first electron transport layer 150 and emits the second material, and using the third deposition source DS3 which was used to form the first electron transport layer 150 and emits the third material. In other words, after forming the first electron transport layer 150, the second electron transport layer 160 may be formed by moving a base supporting the first deposition source DS1, the second deposition source DS2 and the third deposition source DS3 and depositing the second electron transport layer 160 by operating the second deposition source DS2 and the third deposition source DS3 to deposit the fourth and fifth materials, respectively.

In an example embodiment, a forming step may be performed continuously. For example, the first electron transport layer 150 may be deposited by moving the base supporting the first deposition source DS1, the second deposition source DS2 and the third deposition source DS3 to move their respective aim from the first terminal T1 to the second terminal T2. The second electron transport layer 160 may be deposited by moving back the base to move the respective aim of the second deposition source DS2 and the third deposition source DS3 from the second terminal T2 to the first terminal T1. In such an embodiment, the first deposition source DS1 may emit the first material while the base moves from the first terminal T1 to the second terminal T2.

Therefore, in such an embodiment, the first electron transport layer 150 and the second electron transport layer 160 may be formed by only one reciprocating movement of the deposition sources.

In an example embodiment, the second electron transport layer 160 may include a fourth material different from the second material of the first electron transport layer 150 and a fifth material different from the third material of the first electron transport layer 150. In such an embodiment, the second electron transport layer 160 may be formed by a deposition process which is substantially the similar to deposition process for forming the first electron transport layer 150, and the second electron transport layer 160 may be formed by using a fourth deposition source emitting the fourth material and a fifth deposition source emitting the fifth material.

In an example embodiment, the second electron transport layer 160 may be formed by forming a second mixture which contains the fourth material and the fifth material at a suitable (or proper) weight ratio, and depositing the second mixture as a second mixture layer. The deposition may be performed by a sputtering process, a chemical vapor deposition process, a pulsed laser deposition process, a vacuum deposition process or an atomic layer deposition process, for example, but the method of forming the second mixture layer is not limited thereto. Alternatively, the second mixture layer may be formed by a mask sputtering process, a photoresist process, a printing process, an inkjet process, a spin coating process, a casting process or a Langmuir-Blodget process, for example, but the method of forming the second mixture layer is not limited thereto.

An electron injection layer 170 may be formed on the second electron transport layer 160. The electron injection layer 170 may be formed by a deposition process, a mask sputtering process, a photoresist process, a printing process or an inkjet process, for example, but the method of forming the electron injection layer is not limited thereto. The electron injection layer 170 may include (or be formed with) lithium fluoride, sodium chloride, barium fluoride, caesium fluoride, lithium oxide, an aluminum oxide, barium oxide, a fullerene or a mixture thereof, for example, but the electron injection layer is not limited thereto.

Figure 9E:
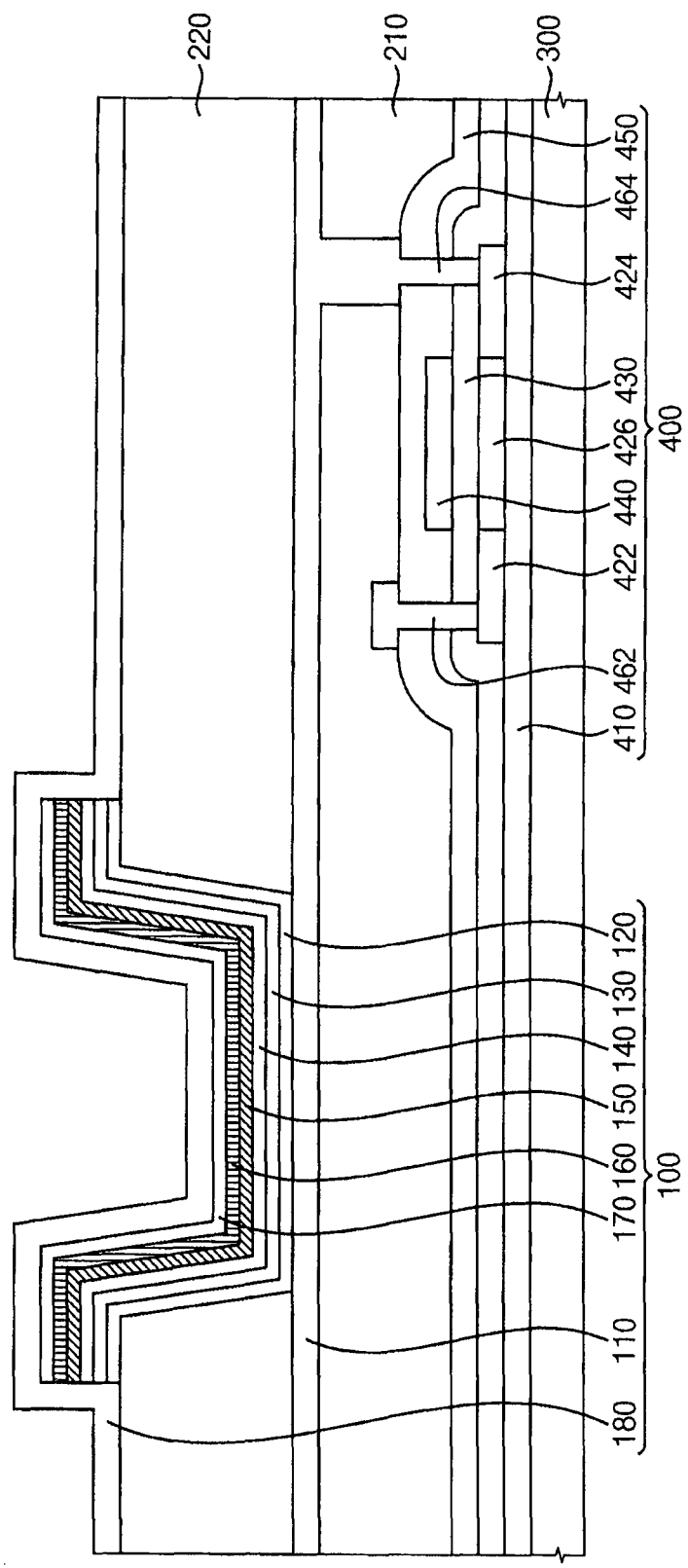

As illustrated in FIG. 9E, after depositing a fourth conductive layer to cover the electron injection layer 170 and the pixel definition layer 220, a second electrode 180 may be formed by patterning the fourth conductive layer. The second electrode 180 may be formed by substantially the same method as those of forming the first electrode 110. The second electrode 180 may be formed with a metal or an alloy thereof having high reflectivity, in order to be a reflective electrode. Alternatively, the second electrode 180 may be formed with transparent conductive material having high transmittance, in order to be a transmitting electrode.

As illustrated in FIG. 9F, the organic light emitting display apparatus may be manufactured by providing (or disposing) the second substrate 500 to cover and encapsulate the organic light emitting device 100. The encapsulation may be performed by applying a sealing material on a lower surface of the second substrate 500, bonding the second substrate 500 with the first substrate 300, and hardening the sealing material using a laser or an ultra violet ray.

In one example embodiment, the second substrate 500 may be provided (or disposed) to be separated from the organic light emitting device 100 by a predetermined (or set) space. In another example embodiment, the second substrate 500 may be provided (or disposed) to directly contact the organic light emitting device 100. In such an embodiment, a visibility of the organic light emitting display apparatus is further improved.

Therefore, the method of manufacturing the organic light emitting display apparatus in accordance with aspects of the example embodiments can provide an organic light emitting display apparatus having not only improved thermal stability but also improved luminous efficiency and lifetime.

Embodiments of the present invention may apply to any suitable organic light emitting device including an electron transport layer including (or consisting of) three materials, each of the three materials having a different property. In other words, embodiments of the present invention may be applied to a top emission device, a bottom emission device and a double-side emission device (e.g., a dual emission device). The organic light emitting device may include a phosphorescent organic light emitting device and a fluorescent organic light emitting device. Embodiments, of the present invention may be applied to any suitable organic light emitting device which emits a red light, a green light, a blue light and/or a white light, for example, but the organic light emitting device is not limited thereto. The organic light emitting display apparatus including the organic light emitting device may be used as a monitor of a television receiver set, a desktop, a laptop, a personal digital assistant (PDA), a cellular telephone, a portable media player (e.g., an MP3 player), a tablet personal computer (PC), a GPS navigator, for example, but organic light emitting display apparatus is not limited thereto. The organic light emitting device may also be applied to a lamp of a light apparatus.

The foregoing is illustrative of example embodiments of the subject matter disclosed and is not to be construed as limiting thereof. Although a few example embodiments have been described, those skilled in the art will readily appreciate that many modifications are possible in the example embodiments without materially departing from the novel teachings and advantages of embodiments of the present invention. Accordingly, all such modifications are intended to be included within the scope of the present invention as defined in the claims. Therefore, it is to be understood that the foregoing is illustrative of various example embodiments and the present invention is not to be construed as being limited to the specific example embodiments disclosed, and that modifications to the disclosed example embodiments, as well as other example embodiments, are intended to be included within the scope of the appended claims, and equivalents thereof.

What is claimed is:

1. An organic light emitting device comprising:
a first electrode;
a hole injection layer on the first electrode;
a hole transport layer on the hole injection layer;
an organic light emitting layer on the hole transport layer;
a first electron transport layer on the organic light emitting layer, wherein the first electron transport layer comprises a first material for improving a thermal stability of the organic light emitting device, a second material for improving a luminous efficiency of the organic light emitting device and a third material for reducing a driving voltage of the organic light emitting device;
a second electron transport layer on the first electron transport layer wherein the second electron transport layer is laminated with the first electron transport layer;
an electron injection layer on the second electron transport layer; and
a second electrode on the electron injection layer, wherein the second electrode faces the first electrode.

2. The organic light emitting device of claim 1, wherein the first material comprises an anthracene derivative.

3. The organic light emitting device of claim 1, wherein the second material comprises at least one selected from the group consisting of a pyrazine derivative and a triazine derivative.

4. The organic light emitting device of claim 1, wherein the third material comprises at least one selected from the group consisting of an alkali metal and a complex of the alkali metal.

5. The organic light emitting device of claim 1, wherein the first electron transport layer comprises the first material in a range of about 20% to about 80% by weight ratio, based on the total weight of the first electron transport layer.

6. The organic light emitting device of claim 1, wherein the first electron transport layer has a thickness of about 25 Å to about 200 Å.

7. The organic light emitting device of claim 1, wherein the second electron transport layer comprises a fourth material for improving the luminous efficiency of the organic light emitting device.

8. The organic light emitting device of claim 7, wherein the fourth material comprises at least one selected from the group consisting of a pyrazine derivative and a triazine derivative.

9. The organic light emitting device of claim 7, wherein the second electron transport layer further comprises a fifth material for reducing the driving voltage of the organic light emitting device.

10. The organic light emitting device of claim 9, wherein the fifth material comprises at least one selected from the group consisting of an alkali metal and a complex of the alkali metal.

11. The organic light emitting device of claim 10, wherein the fourth material is substantially the same as the second material, and the fifth material is substantially the same as the third material.

* * * * *